US012755805B2

(12) United States Patent
Oh et al.

(10) Patent No.: US 12,755,805 B2
(45) Date of Patent: Oct. 6, 2026

(54) MEMORY DEVICE INCLUDING ERROR LOGGING DEVICE AND OPERATING METHODS THEREOF

(71) Applicant: SK hynix Inc., Icheon-si (KR)

(72) Inventors: Eui Sang Oh, San Jose, CA (US); Hoiju Chung, San Jose, CA (US); Yong Jun Lee, San Jose, CA (US); Seung Min Baek, San Jose, CA (US); Woong Ju Jang, San Jose, CA (US)

(73) Assignee: SK hynix Inc., Icheon-si (KR)

( * ) Notice: Subject to any disclaimer, the term of this patent is extended or adjusted under 35 U.S.C. 154(b) by 31 days.

(21) Appl. No.: 18/975,886

(22) Filed: Dec. 10, 2024

(65) Prior Publication Data

US 2026/0011388 A1 Jan. 8, 2026

Related U.S. Application Data

(60) Provisional application No. 63/667,410, filed on Jul. 3, 2024.

(51) Int. Cl.
*G11C 29/18* (2006.01)
*G11C 29/44* (2006.01)

(52) U.S. Cl.
CPC .............. *G11C 29/18* (2013.01); *G11C 29/44* (2013.01)

(58) Field of Classification Search
None
See application file for complete search history.

(56) References Cited

U.S. PATENT DOCUMENTS

2005/0262422 A1* 11/2005 Yamauchi .............. G11C 29/38 714/765
2006/0236178 A1* 10/2006 Satsukawa ............. G11C 29/38 714/726
2014/0020095 A1* 1/2014 Riou ....................... G06F 21/64 726/22
2022/0093200 A1* 3/2022 Kim ....................... G06F 11/106
2022/0208293 A1* 6/2022 Kim ................... G11C 29/4401
(Continued)

OTHER PUBLICATIONS

S. Adham and B. Nadeau-Dostie, "A BIST algorithm for bit/group write enable faults in SRAMs," Records of the 2004 International Workshop on Memory Technology, Design and Testing, 2004., San Jose, CA, USA, 2004, pp. 98-101, (Year: 2004).*

*Primary Examiner* — Daniel F. McMahon

(57) ABSTRACT

A memory device includes a memory cell array including memory cells coupled to a plurality of rows that are subject to error check operations. A fault detection circuit generates a fault address for each of the plurality of rows according to a result of an error check operation and outputs the fault addresses together with a fault input signal to a fault information management circuit. The fault information management circuit uses the fault addresses to generate and store first to third fault addresses, where the first fault address is a start fault address. The start fault address and the second and third fault addresses are compared and used to generate fault mode information that defines a relationship between the stored start fault address and the second and third fault addresses, according to the fault input signal. The fault information management circuit outputs error information including the start fault address and the fault mode information.

25 Claims, 22 Drawing Sheets

(56) References Cited

U.S. PATENT DOCUMENTS

| | | | | |
|---|---|---|---|---|
| 2023/0185664 | A1 | 6/2023 | Chung et al. | |
| 2023/0350748 | A1 | 11/2023 | Ayyapureddi | |
| 2024/0006008 | A1* | 1/2024 | Park | G11C 29/022 |
| 2026/0011388 | A1* | 1/2026 | Oh | G11C 29/18 |

* cited by examiner

| | STATE | FSM_ST |
|---|---|---|
| F1 | NRFLT | 0 0 0 |
| F2 | ROW | 0 0 1 |
| F3 | MWLE, MWLO | 0 1 0 |
| F4 | MWL | 0 1 1 |
| F5 | EAWL | 1 0 0 |
| F6 | EEWL | 1 0 1 |
| F7 | EWL, OWL | 1 1 0 |
| F8 | ETC | 1 1 1 |

MEMORY DEVICE INCLUDING ERROR LOGGING DEVICE AND OPERATING METHODS THEREOF

CROSS-REFERENCE TO RELATED APPLICATION

This patent application claims the benefit of priority under 35 U.S.C. § 119(e) to U.S. Provisional Application No. 63/667,410 filed on Jul. 3, 2024, which is incorporated herein by reference in its entirety.

BACKGROUND

1. Field

Various embodiments of the present disclosure relate to a semiconductor design technology, and more particularly, to a memory system and a memory device for performing an error logging operation depending on an error check operation.

2. Description of the Related Art

In the early days of the semiconductor memory industry, a memory chip that semiconductor wafer that passed fabrication processes had many original good dies with no defective memory cells. However, as the capacity of memory devices gradually increase, making a memory device completely free of defective memory cells becomes more difficult, and at present, it may be said that it is not possible to fabricate a memory device with no defective memory cells. Some current solutions to this problem include methods of repairing defective memory cells of a memory device with redundant memory cells or methods of correcting an error in data of memory cells using an error correction circuit.

Recently, various methods for efficiently performing an error check operation and an error logging operation have been discussed. This disclosure describes a memory device that performs an error check operation to select an area with many errors by checking errors in internal data using an embedded error correction circuit, and that performs an error logging operation to log error information on the selected area according to the error check operation.

SUMMARY

Embodiments of the present disclosure are directed to a memory device capable of providing information on multiple row (or multi-row) faults as well as a single row fault during an error logging operation depending on an error check operation, and a method of operating the same.

In accordance with an embodiment of the present disclosure, a memory device includes: a memory cell array including memory cells coupled to a plurality of rows; a fault detection circuit configured to generate first to third fault addresses according to a result of an error check operation for each of the plurality of rows and sequentially outputs the first to third fault addresses together with a fault input signal; and a fault information management circuit configured to store the first fault address as a start fault address and generate fault mode information that defines a relationship between the stored start fault address and the second and third fault addresses, according to the fault input signal, and to output error information including the start fault address and the fault mode information.

In accordance with an embodiment of the present disclosure, an error logging device includes a fault detection circuit configured to output a fault address with a fault input signal; an address storage circuit configured to store the fault address as a start fault address according to a reset signal and the fault input signal, store the fault address as a first comparison address according to the fault input signal inputted with an odd-numbered order, and store the fault address as a second comparison address according to the fault input signal inputted with an even-numbered order; a finite state machine (FSM) configured to update fault mode information according to a result of comparing the first comparison address and the second comparison address; and an error information output circuit configured to output error information including the fault mode information and the start fault address according to an error information request command.

In accordance with an embodiment of the present disclosure, an error logging method includes initializing fault mode information according to a reset signal; storing a fault address as a starting fault address according to the fault input signal input for a first time after initializing, and updating the fault mode information; storing the fault address as a first comparison address according to the fault input signal input with an odd-numbered order, storing the fault address as a second comparison address according to the fault input signal input with an even-numbered order, and updating the fault mode information according to a result of comparing the first comparison address and the second comparison address; and outputting error information including the fault mode information and the start fault address according to an error information request command.

In accordance with an embodiment of the present disclosure, a memory system includes a memory controller; and a memory device configured to perform a scrub operation on each of a plurality of rows under the control of the memory controller, and generate a reset signal according to the scrub operation, wherein the memory controller includes: a fault detection circuit configured to generate first to third fault addresses according to the scrub operation and sequentially output the first to third fault addresses together with a fault input signal; and a fault information management circuit configured to store the first fault address as a start fault address and generate fault mode information that defines a relationship between the stored start fault address and the second and third fault addresses, according to the fault input signal and the reset signal, and to output error information including the start fault address and the fault mode information.

According to embodiments of the present invention, the memory device may provide the information on the multi-row faults during the error logging operation. Thus, it is possible to provide optimized reliability, accessibility, and serviceability (RAS) operation.

These and other features and advantages of the embodiments of the present disclosure will become apparent to those skilled in the art from the following detailed description in conjunction with the following drawings.

DETAILED DESCRIPTION

Figure 1:
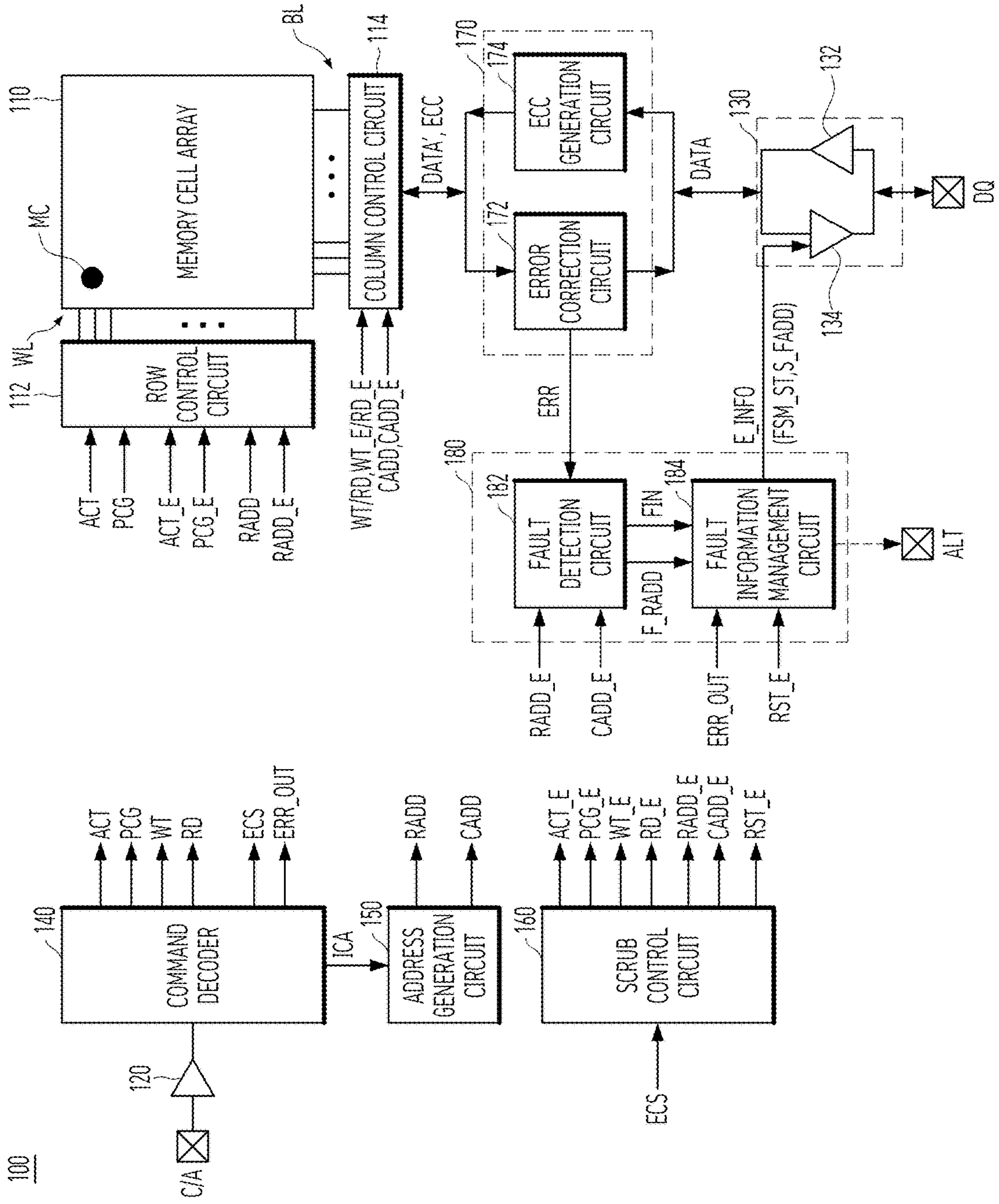
FIG. 1 is a block diagram illustrating a memory device according to an embodiment of the present disclosure.

Various embodiments of the present disclosure will be described below in more detail with reference to the accompanying drawings. The embodiments of the present disclosure may, however, be in different forms and should not be construed as limited to the embodiments set forth herein. Rather, these embodiments are provided so that this disclosure will be thorough and complete, and will fully convey the scope of the present disclosure to those skilled in the art. Throughout this disclosure, like reference numerals refer to like parts throughout the various figures and embodiments of the present disclosure.

It will be understood that when an element is referred to as being "coupled" or "connected" to another element, it may mean that the two are directly coupled or the two are electrically connected to each other with another circuit or element intervening therebetween. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof. In the present disclosure, the singular forms are intended to include the plural forms as well, unless the context clearly indicates otherwise.

Figure 2A:
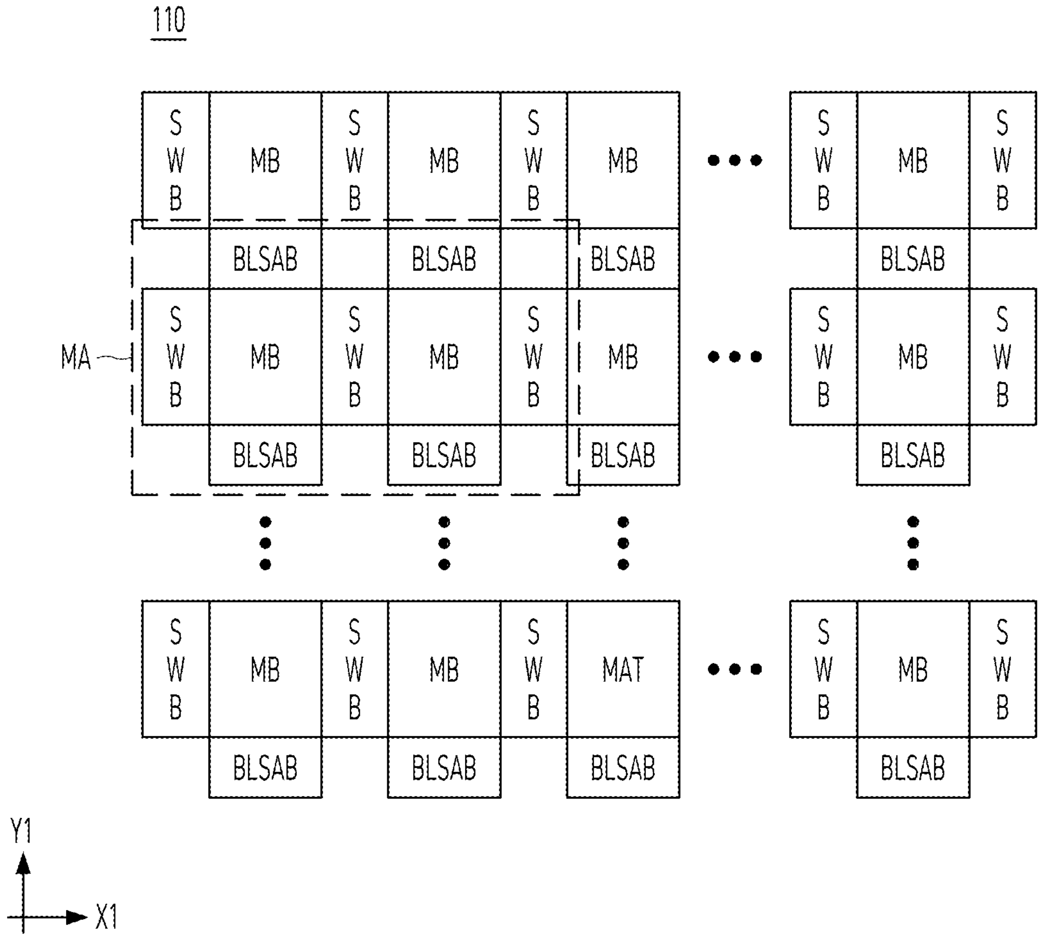
FIGS. 2A and 2B are diagrams for describing a memory cell array of FIG. 1 according to an embodiment of the present disclosure.
Figure 2B:
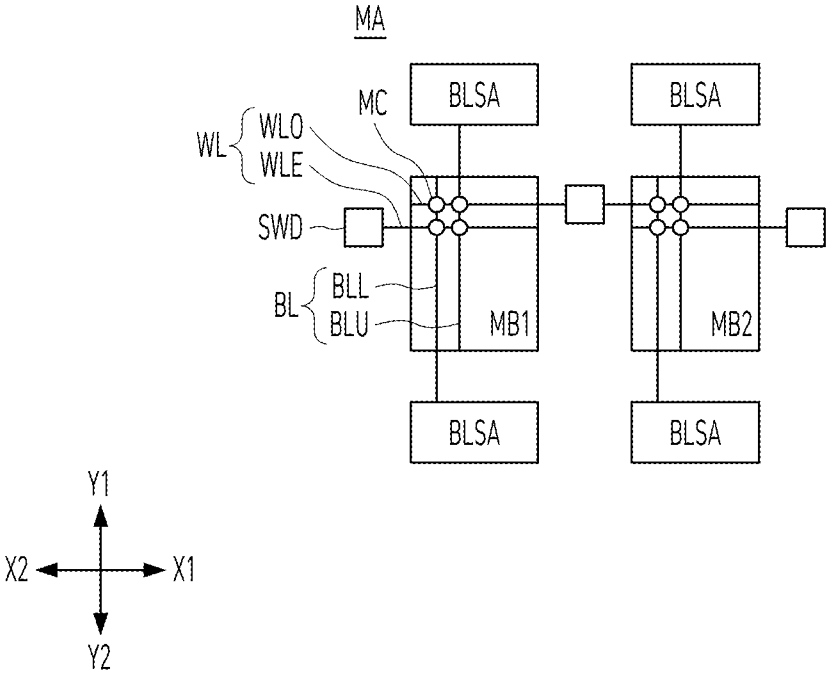
Figure 3:
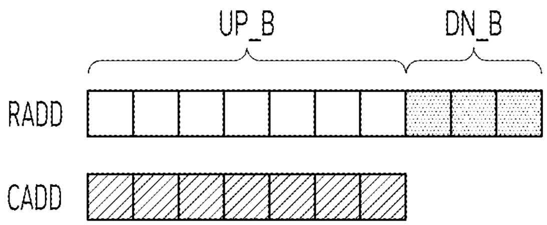
FIG. 3 is a block diagram illustrating a configuration of a row address and a column address of FIG. 1.

FIG. 1 is a block diagram illustrating a memory device according to an embodiment of the present disclosure. FIGS. 2A and 2B are diagrams for describing a memory cell array of FIG. 1 according to an embodiment of the present disclosure. FIG. 3 is a block diagram illustrating a configuration of a row address and a column address of FIG. 1.

Referring to FIG. 1, a memory device 100 may include a memory cell array 110, a row control circuit 112, a column control circuit 114, a command/address (CA) receiving circuit 120, a data input/output circuit 130, a command decoder 140, an address generation circuit 150, a scrub control circuit 160, an error correction code (ECC) engine 170, and an error logging circuit 180.

The memory cell array 110 may include a plurality of memory cells MC disposed in an array type. The plurality of memory cells MC may be coupled to the row control circuit 112 through a plurality of word lines WL and coupled to the column control circuit 114 through a plurality of bit lines BL. The plurality of word lines WL may extend in a first direction (e.g., a row direction) and may be sequentially disposed in a second direction (e.g., a column direction) perpendicular to the first direction. The plurality of bit lines BL may extend in the column direction and may be sequentially disposed in the row direction. The memory cell array 110 may be composed of at least one bank. The number of banks or the number of memory cells MC may be determined depending on the capacity of the memory device 100. The memory cell array 110 may include a plurality of memory blocks (hereinafter, referred to as "cell blocks") each including a plurality of memory cells MC.

Referring to FIG. 2A, the memory cell array 110 may include a plurality of cell blocks MB arranged in an array form in a first direction X1 and a second direction Y1 intersecting the first direction X1. Each cell block MB may include a plurality of memory cells MC connected between a plurality of word lines WL and a plurality of bit lines BL. The cell blocks MB arranged in the row direction X1 may be divided into the plurality of bit lines BL, and the cell blocks MB arranged in the column direction Y1 may be divided into the plurality of word lines WL. Sub-word line driver regions SWB may be arranged between cell blocks MB disposed in the first direction X1. A plurality of sub-word line drivers may be disposed in the sub-word line driver region SWB. Bit line sense amplifier regions BLSAB may be arranged between cell blocks MB disposed in the second direction Y1. A plurality of bit line sense amplifiers may be disposed in the bit line sense amplifier region BLSAB. In an embodiment of the present disclosure, the "cell block" may be defined as a set of memory cells that share word lines WL and bit lines BL, and arranged in the first direction X1 and the second direction Y1.

For reference, in order to reduce propagation delay of a word line voltage, which occurs as the number of memory cells connected to the word lines increases and a distance between the word lines decreases, one main word line may be divided into a plurality of (e.g., eight) sub-word lines, which are driven by the sub-word line drivers. Hereinafter, the word lines WL mentioned in the present invention may correspond to known sub-word lines.

Referring to FIG. 2B, a partial area MA of FIG. 2A is shown.

The squares between the cell blocks MB may represent the sub-word line drivers SWD, and the lines extending to the left and right of the sub-word line drivers SWD may represent the word lines. In reality, a much larger number of sub-word line drivers SWD and word lines exist, but only a part of the lines are shown to simplify the illustration.

Each of the cell blocks MB may include odd-numbered word lines (hereinafter, referred to as "first word lines WLO") and even-numbered word lines (hereinafter, referred to as "second word lines WLE") extending in the first direction X1 and alternating with each other in the second direction Y1. In odd-numbered cell blocks (e.g., MB1 in FIG. 2B), the first word lines WLO may share sub-word line drivers SWD with an adjacent cell block in the first direction X1, and the second word lines WLE may share sub-word line drivers SWD with an adjacent cell block in a direction X2 opposite to the first direction X1. Conversely, in even-numbered cell blocks (e.g., MB2 in FIG. 2B), the second word lines WLE may share sub-word line drivers SWD with an adjacent cell block in the first direction X1, and the first word lines WLO may share sub-word line drivers SWD with an adjacent cell block in the direction X2. That is, since two adjacent cell blocks MB in the first direction X1 share sub-word line drivers SWD, one sub-word line driver SWD may be allocated to two adjacent cell blocks MB in the first direction X1.

Each of the cell blocks MB may include first bit lines BLU and second bit lines BLL extending in the second direction Y1 and alternately disposed in the first direction X1. The first bit lines BLU may share bit line sense amplifiers BLSA with an adjacent cell block (not illustrated) in the second direction Y1, and the second bit lines BLL may share bit line sense amplifiers BLSA with an adjacent cell block (not illustrated) in a direction Y2 opposite to the second direction Y1. That is, since two adjacent cell blocks MB in the second direction Y1 share bit line sense amplifiers BLSA, one bit line sense amplifier BLSA may be allocated to two adjacent cell blocks MB in the second direction Y1.

Referring back to FIG. 1, the CA receiving circuit 120 may receive a command/address signal C/A. Depending on the type of memory device 100, a command and an address may be input through the same input terminals, or a command and an address may be input through separate input terminals. In FIG. 1, it is illustrated that the command and the address are input through the same input terminals. The command/address signal C/A may be formed of multiple bits.

The data input/output circuit 130 may transmit data DQ to a memory controller (not shown), or receive the data DQ from the memory controller. The data input/output circuit 130 may include a data input circuit 132 and a data output circuit 134. The data input circuit 132 may receive the data DQ to be written to the memory cell array 110 during a write operation. The data output circuit 134 may output the data DQ read from the memory cell array 110 during a read operation.

The command decoder 140 may decode the command/address signal C/A received by the CA receiving circuit 120 to generate an active command ACT, a precharge command PCG, a write command WT, a read command RD, a scrub command ECS, and an error information request command ERR_OUT. The active command ACT is a signal input when an active operation is instructed, the precharge command PCG is a signal input when a precharge operation is instructed, the write command WT is a signal input when a write operation is instructed, and the read command RD may be a signal input when a read operation is instructed. In addition, the scrub command ECS may be a signal input when an error check operation is instructed, and the error information request command ERR_OUT may be a signal input when error information is requested. For reference, the error check operation, also called an error check and scrub (ECS) operation, may mean an operation of reading data DATA' from the memory cell array 110 and checking for errors in the read data DATA' using the error correction code (ECC) engine 170, and selecting an area with many errors.

The address generation circuit 150 may classify an internal address ICA received from the command decoder 140 into a row address RADD and a column address CADD. The row address RADD may be an address for selecting one of the plurality of word lines WL, and the column address CADD may be an address for selecting some bit lines for performing a read operation, from the plurality of bit lines BL. Each of the row address RADD and the column address CADD may be formed of multiple bits. Depending on an embodiment, the address generation circuit 150 may further generate a block address for designating a plurality of cell blocks, and may generate a bank address, a rank address, and a channel address according to the configuration of the memory device.

The row address RADD may be divided into an upper bit group for designating one from a plurality of main word lines and a lower bit group for designating one from a plurality of sub-word lines allocated to one main word line. In addition, the column address CADD may be composed of bits for designating one from a plurality of columns, and a predetermined number of bit lines may be selected when one column is selected. For example, referring to FIG. 3, a row address RADD may be divided into a 7-bit upper bit group UP_B assigned to 128 main word lines and a 3-bit lower bit group DN_B assigned to 8 sub-word lines allocated to one main word line. In addition, the column address CADD is composed of 7-bits assigned to 128 columns, and eight bit lines may be selected as one column is designated.

Hereinafter, a plurality of word lines WL mentioned in the present invention will be referred to as a plurality of rows.

Referring back to FIG. 1, the scrub control circuit 160 may generate a scrub active signal ACT_E, a scrub precharge signal PCG_E, a scrub write signal WT_E and a scrub read signal RD_E, to perform an error check operation according to a scrub command ECS. The scrub control circuit 160 may sequentially activate the scrub active signal ACT_E, the scrub read signal RD_E, the scrub write signal WT_E, and the scrub precharge signal PCG_E according to the scrub command ECS to control the error check operation, including an active operation, a read operation, a write operation, and a precharge operation, to be performed. For reference, the error check operation may be performed by the active operation, the read operation, the write operation, and the precharge operation, but the write operation may be omitted according to an embodiment.

Further, the scrub control circuit 160 may generate a scrub row address RADD_E and a scrub column address CADD_E according to the scrub command ECS. The scrub control circuit 160 may increase a value of the scrub column address CADD_E by "+1" whenever the scrub command ECS is input, and may increase a value of the scrub row address RADD_E by "+1" when the value of the scrub column address CADD_E reaches a maximum value. For example, when the value of the scrub row address RADD_E ranges from 0 to 3 and the value of the scrub column address CADD_E ranges from 0 to 3, the scrub control circuit 160 may generate the scrub addresses (RADD_E, CADD_E) to be changed whenever the scrub command ECS is input, as follows: (0, 0)→(0, 1)→(0, 2)→(0, 3)→(1, 0)→(1, 1)→(1, 2)→(1, 3)→(2, 0)→(2, 1)→(2, 2)→(2, 3)→(3, 0)→(3, 1)→(3, 2)→(3, 3).

In an embodiment of the present invention, the scrub control circuit 160 may generate a reset signal RST_E for initializing error information E_INFO provided from the error logging circuit 180. In an embodiment, the scrub control circuit 160 may generate a reset signal RST_E that is activated when an error check operation for rows included in at least two adjacent cell blocks is completed. The at least two adjacent cell blocks may be selected from cell blocks MB arranged in the column direction Y1 described in FIGS. 2A and 2B, that is, from cell blocks MB divided by a plurality of rows WL. For example, when 128 rows WL are arranged in each cell block, the scrub control circuit 160 may activate the reset signal RST_E when an error check operation for 256 rows included in two adjacent cell blocks is completed.

The ECC engine 170 may include an error correction circuit 172 and an ECC generation circuit 174.

The error correction circuit 172 may correct an error of the read data DATA' using the error correction code ECC read from the memory cell array 110 during a read operation, to output error-corrected data DATA. Here, correcting the error may mean an error check operation of checking the error in the read data DATA' using the error correction code ECC and an error correction operation of correcting the error in the read data DATA' when the error is detected. The error correction circuit 172 may check and correct an error of the error correction code ECC together with the data DATA'. When an error of the data DATA' is detected and the error is corrected, the data DATA' input to the error correction circuit 172 and the data DATA output from the error correction circuit 172 may be different from each other. The error correction circuit 172 may output an error signal ERR that is activated when an error is detected during the error check operation. In the following embodiment, the error signal ERR may be a signal activated to a logic high level.

The ECC generation circuit 174 may generate the error correction code ECC by using data DATA during a write operation. During the write operation, since the error correction code ECC is generated using the data DATA and the error of the data DATA is not corrected, the data DATA input to the ECC generation circuit 174 are identical to the data DATA' output from the ECC generation circuit 174.

The error logging circuit 180 may log an error found during the error check operation. More specifically, the error logging circuit 180 may include a fault detection circuit 182 and a fault information management circuit 184.

The fault detection circuit 182 may generate a fault address F_RADD according to a result of the error check operation for each of the plurality of rows WL. The fault detection circuit 182 may output the fault address F_RADD together with a fault input signal FIN. The fault detection circuit 182 may generate the fault address F_RADD according to the error signal ERR activated during the error check operation for each of the plurality of rows WL. For example, the fault detection circuit 182 may count the number of errors for each row to generate an address (i.e., a row address) of a row in which the number of errors exceeds a threshold value as the fault address F_RADD. Since the fault detection circuit 182 receives the scrub row address RADD_E, the scrub column address CADD_E, and the error signal ERR, it is possible to check which area of the memory cell array 110 where the error is found. A detailed operation of the fault detection circuit 182 will be described with reference to FIG. 6.

The fault information management circuit 184 may store the fault address F_RADD input for a first time after activation of the reset signal RST_E as a start fault address S_FADD, according to the fault input signal FIN. The fault information management circuit 184 may generate fault mode information FSM_ST that defines a fault mode as a relationship between the stored start fault address S_FADD and subsequently inputted fault addresses F_RADD, according to the fault input signal FIN. The fault information management circuit 184 may output the error information E_INFO including the start fault address S_FADD and the fault mode information FSM_ST, according to the error information request command ERR_OUT. The fault information management circuit 184 may transmit the error information E_INFO to the memory controller through the data output circuit 134 of the data input/output circuit 130 according to the error information request command ERR_OUT.

In addition, the fault information management circuit 184 may initialize the fault mode information FSM_ST according to the reset signal RST_E provided from the scrub control circuit 160. Since the memory controller can cope with a fault related to rows included in two cell blocks, the fault information management circuit 184 may initialize the fault mode information FSM_ST according to the reset signal RST_E.

The fault mode information FSM_ST may be set to one of a plurality of state values defining faults of one or more rows related to a defective row designated by the start fault address S_FADD. The fault information management circuit 184 may change or maintain (i.e., update) the fault mode information F_ST to one of the state values by comparing a previously inputted fault address F_RADD with a current inputted fault address F_RADD according to the fault input signal FIN. The state values that the fault mode information FSM_ST may have will be described in FIG. 11.

Depending on an embodiment, the fault information management circuit 184 may output an alert signal ALT to the memory controller when a fault mode (hereinafter, referred to as a multi-row fault mode) caused by two or more rows is specified according to the fault mode information FSM_ST. For example, when the fault mode information FSM_ST notifies a multi-row fault mode that may cause an uncorrectable error (UE), the fault information management circuit 184 may activate the alert signal ALT. Though FIG. 1 shows that the alert signal ALT is output to the outside through a separate pad, the proposed invention is not limited thereto. Like the error information E_INFO, the alert signal ALT may be provided to the memory controller through the data output circuit 134 of the data input/output circuit 130. A detailed configuration and operation of the fault information management circuit 184 will be described in FIGS. 7 to 18.

The row control circuit 112 may perform an active operation of activating a row selected by the row address RADD in response to the active command ACT, and may perform a precharge operation of precharging the activated row in response to the precharge command PCG. Further, the row control circuit 112 may perform an active operation of activating a row selected by the scrub row address RADD_E in response to the scrub active signal ACT_E, and a precharge operation of precharging the active row in response to the scrub precharge signal PCG_E.

The column control circuit 114 may select some bit lines of the plurality of bit lines BL of the memory cell array 110 according to the column address CADD, perform a read operation of reading the data DATA' and the error correction code ECC from the memory cells MC through the selected bit lines in response to the read command RD, or perform a write operation of writing the data DATA' and the error correction code ECC to the memory cells MC through the selected bit lines in response to the write command WT. Further, the column control circuit 114 may select some bit lines of the plurality of bit lines BL of the memory cell array 110 according to the scrub column address CADD_E, perform a read operation of reading the data DATA' and the error correction code ECC from the memory cells MC through the selected bit lines in response to the scrub read signal RD_E, or perform a write operation of writing the data DATA' and the error correction code ECC to the memory cells MC through the selected bit lines in response to the scrub write command WT_E.

As described above, according to an embodiment of the present invention, the memory device 100 may store the fault address F_RADD detected for the first time during the error check operation for each row, as the start fault address S_FADD, and update the fault mode information FSM_ST that defines the relationship between the start fault address S_FADD and subsequent fault addresses F_RADD whenever the fault address is subsequently detected. Thereafter, the memory device 100 may provide error information E_INFO including both the fault mode information FSM_ST and the start fault address S_FADD to the memory controller, according to the error information request command ERR_OUT. Conventionally, it was difficult for the memory controller to efficiently perform error management because the memory device provided only information on one or more defective rows, whereas in the present invention, the memory device may provide information on the defective row as well as information defining faults of one or more rows related to the defective row. Accordingly, the memory controller may identify a possible fault mode based on the defective row specified by the start fault address, thereby efficiently managing the error and performing an optimized reliability, accessibility, and serviceability (RAS) operation.

Figure 4:
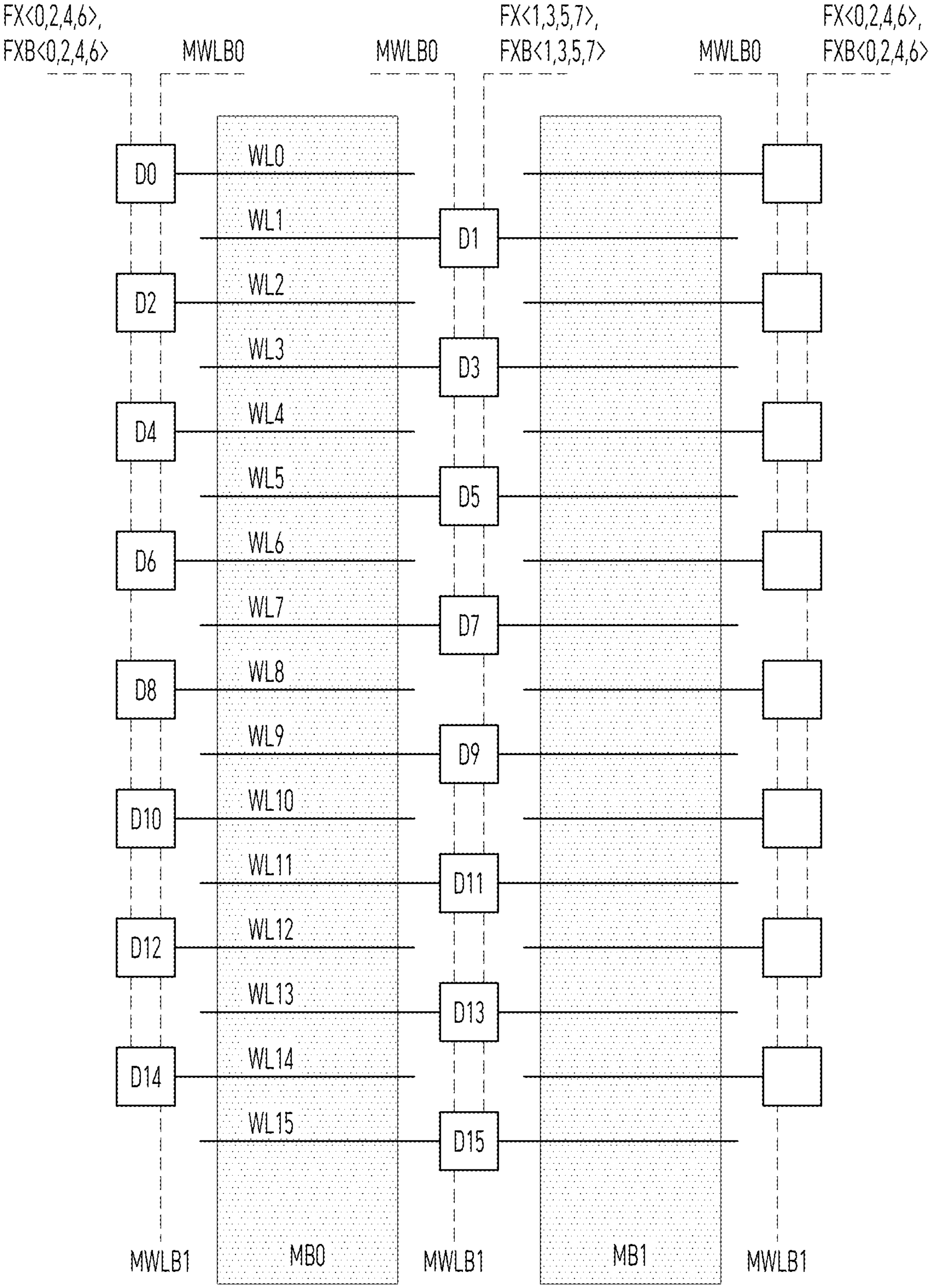
FIG. 4 is a diagram for illustrating an arrangement of sub-word line drivers according to an embodiment of the present disclosure.

FIG. 4 is a diagram for illustrating an arrangement of sub-word line drivers according to an embodiment of the present disclosure. FIG. is a detailed circuit diagram illustrating sub-word line drivers of FIG. 4.

Referring to FIG. 4, a first cell block MB0 and a second cell block MB1 adjacent to each other in a row direction are illustrated. FIG. 4 illustrates two main word lines arranged per cell block, and eight sub-word lines arranged per main word line. That is, first to sixteenth sub-word lines (i.e., rows WL0 to WL15) may extend in a row direction and may be alternately arranged in a column direction, respectively, in the first cell block MB0 and the second cell block MB1.

First to sixteenth sub-word line drivers D0 to D15 for driving the first to sixteenth sub-word lines WL0 to WL15 may be alternately disposed on opposite sides of each cell block. For example, odd-numbered sub-word line drivers disposed at one side of each cell block may drive odd-numbered sub-word lines, and even-numbered sub-word line drivers disposed at the other side may drive even-numbered sub-word lines.

The first to eighth sub-word line drivers D0 to D7 may receive a first main word line driving signal MWLB0 in common, receive respective signals of first and second word line selection signals FX<0:7> and FXB<0:7>, and drive the first to eighth sub-word lines WL0 to WL7. The ninth to sixteenth sub-word line drivers D8 to D15 may receive a second main word line driving signal MWLB1 in common, receive respective signals of the first and second word line selection signals FX<0:7> and FXB<0:7>, and drive the ninth to sixteenth sub-word lines WL8 to WL15. Here, the main word line driving signals MWLB0 and MWLB1 may mean a driving signal transmitted through a main word line.

Figure 5:
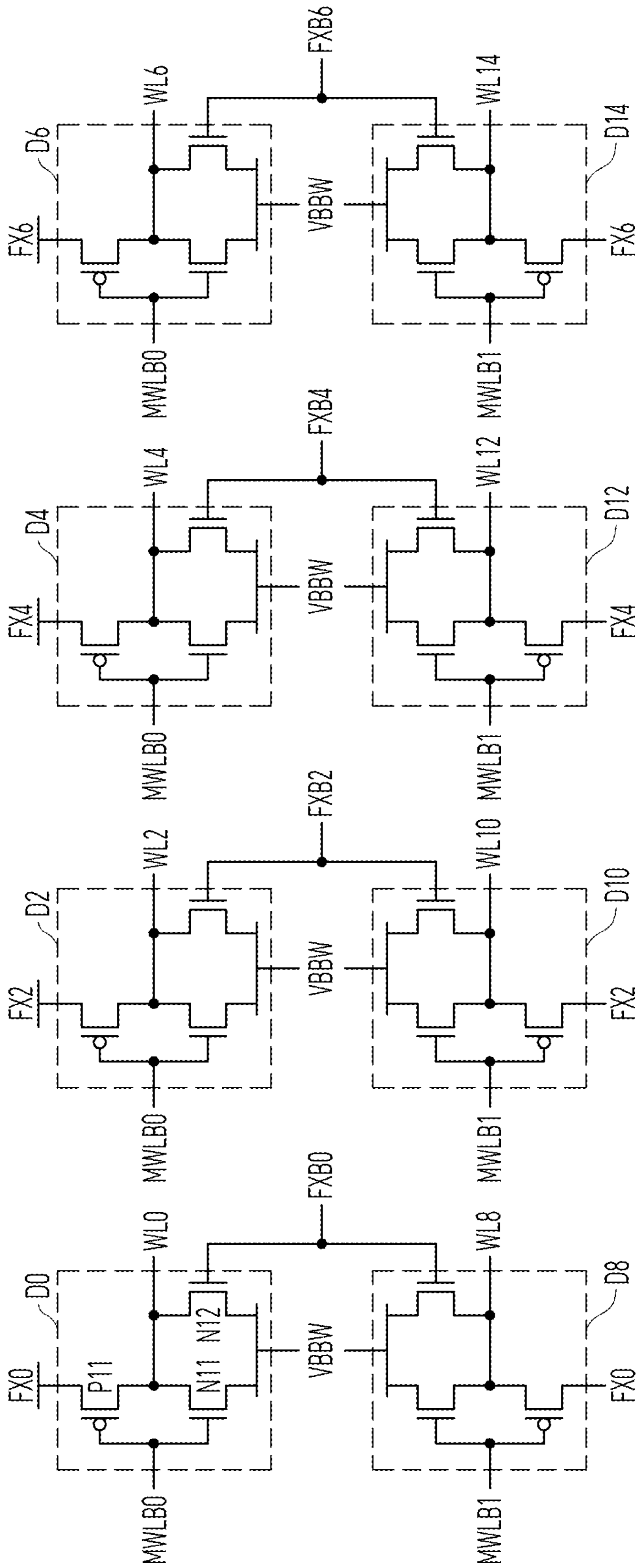
FIG. 5 is a detailed circuit diagram illustrating sub-word line drivers of FIG. 4.

Referring to FIG. 5, the sub-word line drivers D0, D2, D4, D6, D8, D10, D12, and D14 disposed at one side of the first cell block MB0 in FIG. 4 are illustrated. Since each of the sub-word line drivers has the same configuration, the first sub-word line driver D0 will be described as an example.

The first sub-word line driver D0 may include a PMOS transistor P11 and NMOS transistors N11 and N12. The PMOS transistor P11 and the NMOS transistor N11 are coupled in series between an input terminal of the first word line selection signal FX0 and a back bias voltage (VBBW) (or ground voltage VSS) terminal, and receive the main word line driving signal MWLB0 through a common gate. The NMOS transistor N12 is connected between the sub-word line WL0 and the back bias voltage (VBBW) terminal, and receives the second word line selection signal FXB0 through a gate.

Figure 6:
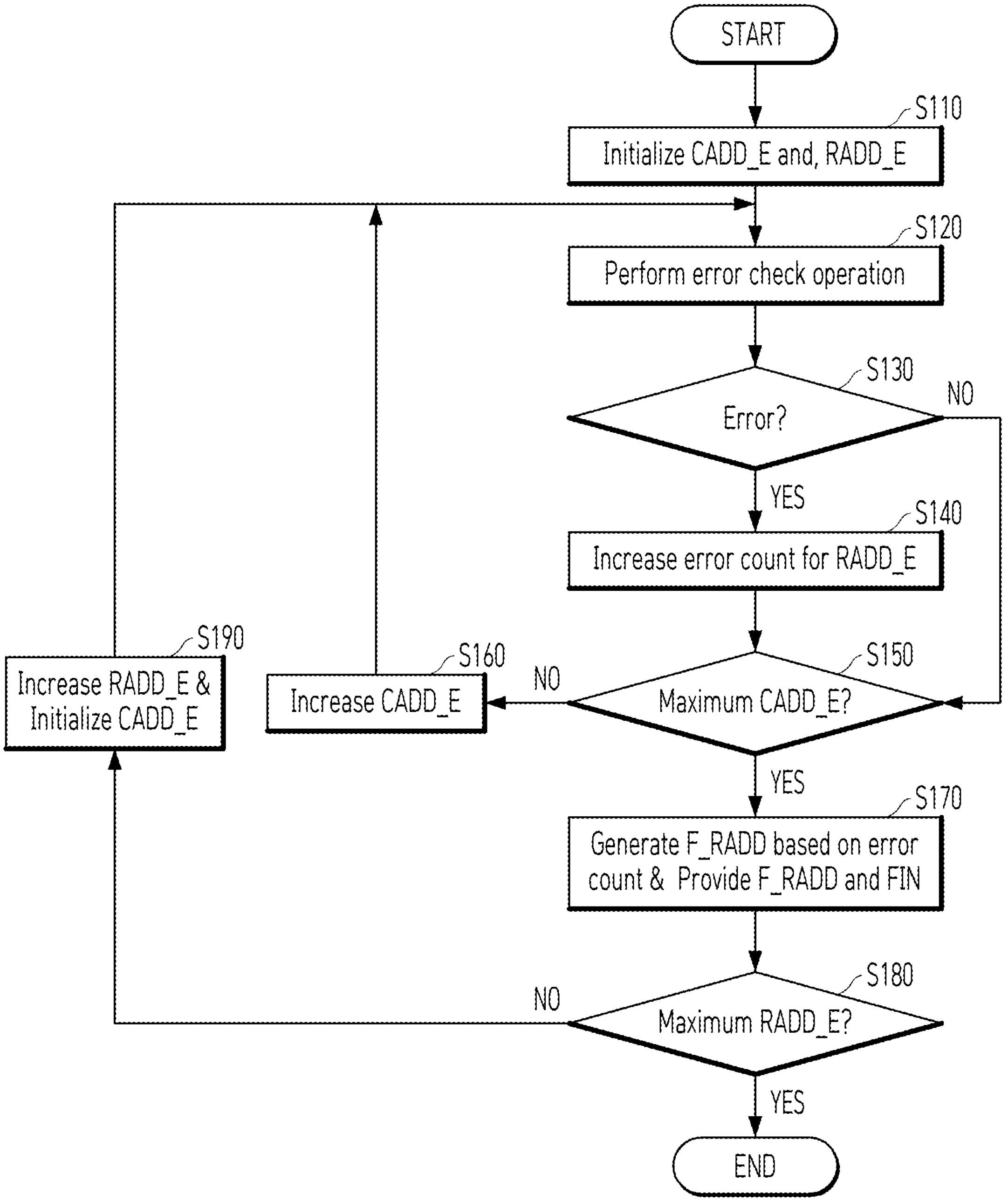
FIG. 6 is a flowchart describing an operation of a fault detection circuit of FIG. 1 according to an embodiment of the present disclosure.

FIG. 6 is a flowchart describing an operation of a fault detection circuit of FIG. 1 according to an embodiment of the present disclosure.

Referring to FIG. 6, a scrub control circuit 160 may initialize scrub row address RADD_E and scrub column address CADD_E according to a scrub command ECS (at S110). In addition, the scrub control circuit 160 may sequentially activate scrub active signal ACT_E, scrub read signal RD_E, scrub write signal WT_E, and scrub precharge signal PCG_E according to the scrub command ECS. Accordingly, an error check operation may be performed on a first row and a first column (at S120).

When an error is found during the error check operation and error correction circuit 172 activates error signal ERR ("YES" in S130), a fault detection circuit 182 may increase the number of error counts for the first row by "+1" (at S140), and then the scrub control circuit 160 may increase the scrub column address CADD_E by "+1" (at S160). Accordingly, an error check operation may be performed on the first row and a second column (at S120).

The above operations from S120 to S160 are repeatedly performed. When error check operations for all columns of the first row are completed and the scrub column address CADD_E reaches a maximum value ("YES" in S150), the fault detection circuit 182 may check whether the error count for the first row exceeds a threshold value. If the error count for the first row exceeds the threshold value, then the fault detection circuit 182 may generate the scrub row address RADD_E of the first row as a fault address F_RADD and provide the fault address F_RADD together with the fault input signal FIN to the fault information management circuit 184 (at S170). When the scrub row address RADD_E reaches a maximum value ("YES" in S180), error check operations for all rows may be completed.

When the scrub row address RADD_E has not reached a maximum value ("NO" in S180), the scrub control circuit 160 may initialize the scrub column address CADD_E and increase the scrub row address RADD_E by "+1" (at S190) . . . . The above operations from S120 to S190 may be repeatedly performed. Accordingly, an error check operation may be performed on a second row and the first column (at S120).

As described above, when the fault address F_RADD is detected according to the error check operation of each row, the fault detection circuit 182 may provide the detected fault address F_RADD along with the fault input signal FIN to the fault information management circuit 184.

Figure 7:
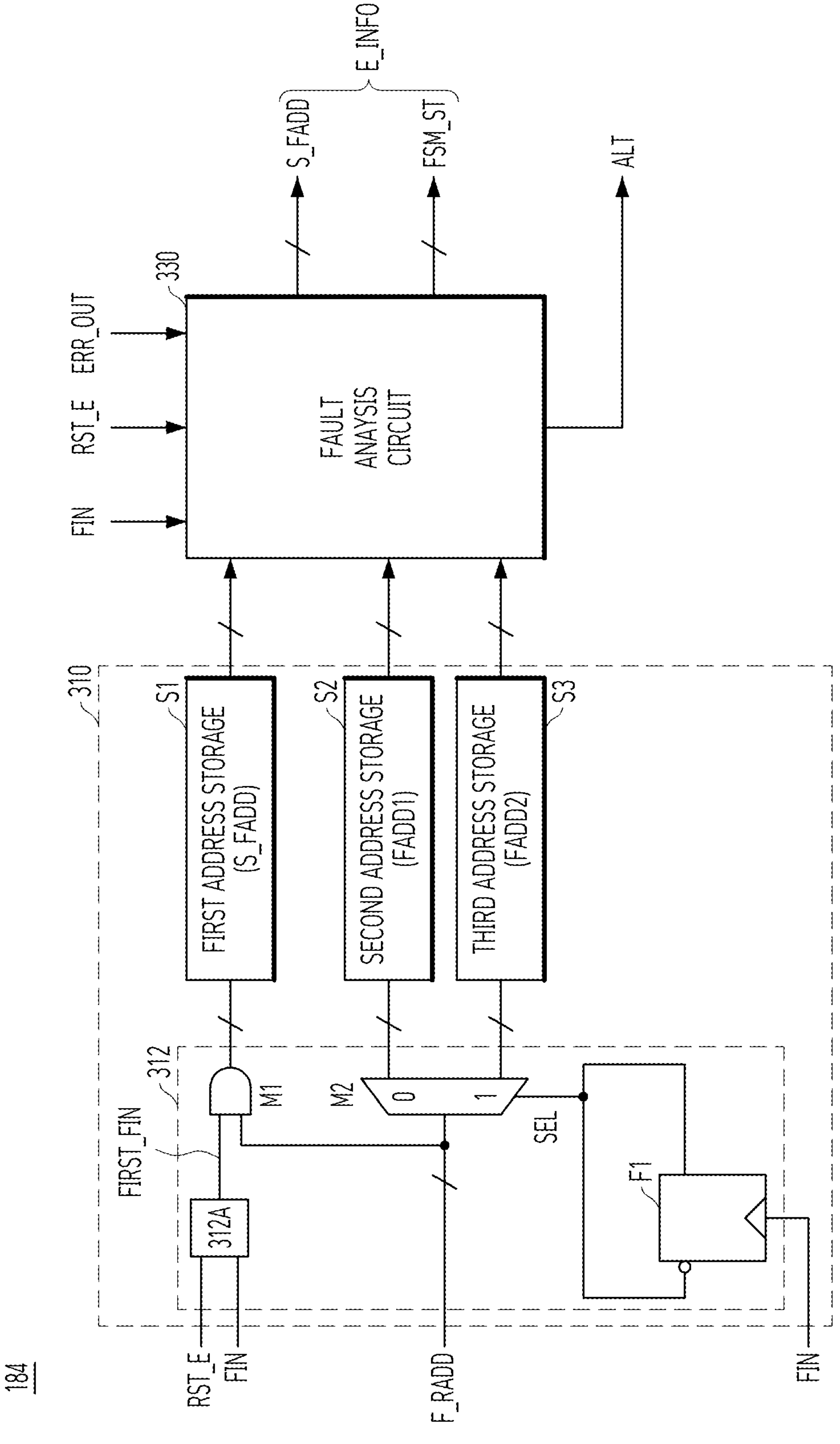
FIG. 7 is a detailed configuration diagram illustrating a fault information management circuit of FIG. 1 according to an embodiment of the present disclosure.

FIG. 7 is a detailed configuration diagram illustrating the fault information management circuit of FIG. 1 according to an embodiment of the present disclosure.

Referring to FIG. 7, a fault information management circuit 184 may include an address storage circuit 310 and a fault analysis circuit 330.

The address storage circuit 310 may store a fault address F_RADD as an initial fault address S_FADD according to a reset signal RST_E and a fault input signal FIN, store the fault address F_RADD as a first comparison address FADD1 according to a fault input signal FIN that is input with an odd-numbered order, and store the fault address F_RADD as a second comparison address FADD2 according to a fault input signal FIN that is input with an even-numbered order.

In more detail, the address storage circuit 310 may include a storage controller 312 and first to third address storages S1 to S3.

The storage controller 312 may output the fault address F_RADD as the start fault address S_FADD according to the reset signal RST_E and the fault input signal FIN, and output the fault address F_RADD as the first comparison address FADD1 or the second comparison address FADD2 according to an input order of the fault input signal FIN. The storage controller 312 may include an initial signal generator 312A, a selection signal generator F1, a first selector M1, and a second selector M2.

The initial signal generator 312A may generate an initial input signal FIRST_FIN by detecting a fault input signal FIN initially inputted after the reset signal RST_E is activated. The selection signal generator F1 may generate a selection signal SEL of a logic low level according to a fault input signal FIN input according to an odd-numbered order, and generate a selection signal SEL of a logic high level according to a fault input signal FIN input according to an even-numbered order. For example, the selection signal generator F1 may be implemented as a flip-flop that receives an inverted signal of the selection signal SEL through an input terminal, receives the fault input signal FIN through a clock terminal, and outputs the selection signal SEL through an output terminal.

The first selector M1 may output the fault address F_RADD as the start fault address S_FADD when the initial input signal FIRST_FIN is activated. For example, the first selector M1 may be implemented with a logic gate for performing a logic AND operation on the initial input signal FIRST_FIN and the fault address F_RADD. Although one AND gate is shown in FIG. 7, as many gates as the number corresponding to the number of bits of the fault address F_RADD may be provided. The second selector M2 may output the first comparison address FADD1 by selecting the fault address F_RADD according to the selection signal SEL of the logic low level, and output the second comparison address FADD2 by selecting the fault address F_RADD according to the selection signal SEL of the logic high level. For example, the second selector M2 may be implemented with a known multiplexer.

The first address storage S1 may store the start fault address S_FADD output from the first selector M1, the second address storage S2 may store the first comparison address FADD1 output from the second selector M2, and the third address storage S3 may store the second comparison address FADD2 output from the second selector M2.

The fault analysis circuit 330 may update the fault mode information FSM_ST by comparing the first comparison address FADD1 stored in the second address storage S2 with the second comparison address FADD2 stored in the third address storage S3, according to the fault input signal FIN. The fault analysis circuit 330 may output the error information E_INFO including the start fault address S_FADD stored in the first address storage S1 and the fault mode information FSM_ST, according to the error information request command ERR_OUT. According to an embodiment, the fault analysis circuit 330 may output the alert signal ALT when the multi-row fault mode is specified according to the fault mode information FSM_ST. The fault analysis circuit 330 may initialize the fault mode information FSM_ST to a default value (e.g., a first state value of "000") according to the reset signal RST_E.

Figure 8:
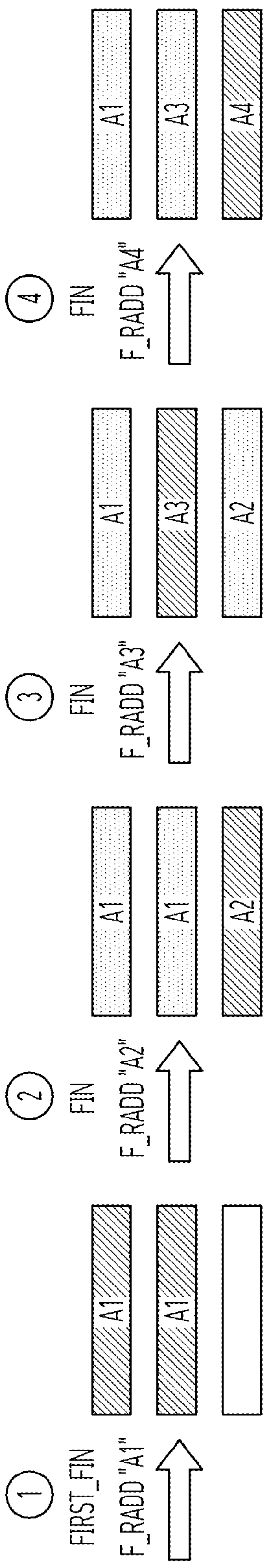
FIG. 8 is a diagram for describing an operation of an address storage circuit of FIG. 7.

FIG. 8 is a diagram for describing an operation of an address storage circuit of FIG. 7.

Referring to FIG. 8, when a fault address F_RADD "A1" is input (①) according to fault input signal FIN, which is first input after reset signal RST_E is activated, an initial input signal FIRST_FIN is activated. In this case, since the fault input signal FIN is input according to odd-numbered ordering, a selection signal SEL of a logic low level is generated. Accordingly, first address storage S1 and second address storage S2 may store the fault address F_RADD "A1" as the start fault address S_FADD and first comparison address FADD1, respectively.

Thereafter, when fault address F_RADD "A2" is input (②) according to fault input signal FIN input according to even-numbered ordering, a selection signal SEL of a logic high level is generated. Accordingly, third address storage S3 may store the fault address F_RADD "A2" as second comparison address FADD2.

Thereafter, when fault address F_RADD "A3" is input (③) according to a fault input signal FIN input according to odd-numbered ordering, a selection signal SEL of a logic low level is generated. Accordingly, second address storage S2 may store the fault address F_RADD "A3" as a first comparison address FADD1.

Thereafter, when fault address F_RADD "A4" is input (④) according to a fault input signal FIN input according to even-numbered ordering, a selection signal SEL of a logic high level is generated. Accordingly, the third address storage S3 may store the fault address F_RADD "A4" as the second comparison address FADD2.

As described above, the address storage circuit 310 may store the fault address F_RADD as the start fault address S_FADD according to the fault input signal FIN input for the first time after initialization. In addition, the address storage circuit 310 may store the fault address F_RADD as first comparison address FADD1 according to an odd-numbered fault input signal FIN, and store the fault address F_RADD as second comparison address FADD2 according to an even-numbered fault input signal FIN. As a result, the address storage circuit 310 may store two consecutive fault addresses F_RADD as the first comparison address FADD1 and the second comparison address FADD2, respectively.

Figures 9, 10:
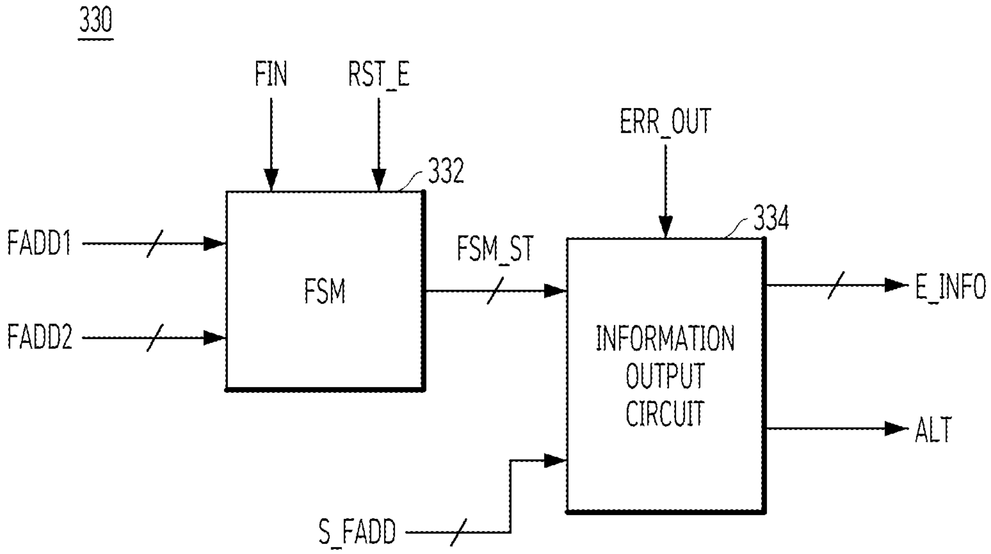
FIG. 9 is a detailed configuration diagram of a fault analysis circuit of FIG. 7.
FIGS. 10 and 11 are a table and a state diagram for defining fault mode information of an FSM of FIG. 9.

FIG. 9 is a detailed configuration diagram of a fault analysis circuit of FIG. 7.

Referring to FIG. 9, a fault analysis circuit 330 may include a finite state machine (FSM) 332 and an information output circuit 334.

The FSM 332 may update the fault mode information FSM_ST by comparing the first comparison address FADD1 and the second comparison address FADD2 according to the fault input signal FIN. The FSM 332 may initialize the fault mode information FSM_ST to the first state value of "000" according to the reset signal RST_E.

The information output circuit 334 may output the error information E_INFO including the start fault address S_FADD and the fault mode information FSM_ST, according to the error information request command ERR_OUT. Depending on a configuration, the information output circuit 334 may output the alert signal ALT when the multi-row fault mode is specified according to the fault mode information FSM_ST.

Figure 11:
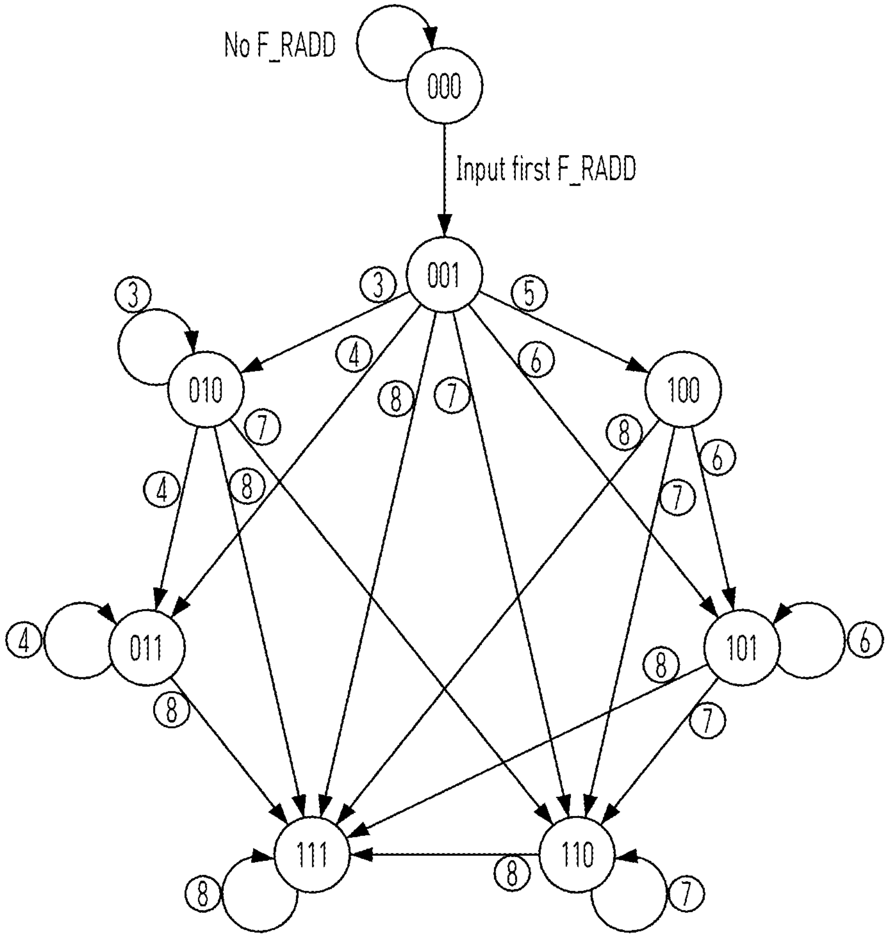

FIGS. 10 and 11 are a table and a state diagram for defining the fault mode information FSM_ST of an FSM 332 of FIG. 9.

Referring to FIG. 10, fault mode information FSM_ST may be configured with 3-bit and set to one of first to eighth state values F1 to F8.

The first state value F1 "NRFLT" may be set to a default value of "000" when no fault address is detected. The second state value F2 "ROW" may be set to a value of "001" when a fault address is initially detected. The third state value F3 "MWLE, MWLO" may be set to a value of "010" when fault addresses are detected in odd-numbered sub-word lines or even-numbered sub-word lines of one main word line. The fourth state value F4 "MWL" may be set to a value of "011" when fault addresses are detected only in sub-word lines coupled to one main word line. The fifth state value F5 "EAWL" may be set to a value of "100" when fault addresses are detected in sub-word lines at the same order, among sub-word lines coupled to two adjacent main word lines. Here, when first to 16th sub-word lines are assigned to two adjacent main word lines, the first and ninth sub-word lines configure sub-word lines at the same order, the second and tenth sub-word lines configure sub-word lines at the same order, and in this way, the eighth and 16th sub-word lines configure sub-word lines at the same order. The sixth state value F6 "EEWL" may be set to a value of "101" when fault addresses are repeatedly detected in sub-word lines at the same order, among sub-word lines coupled to a plurality of main word lines. The seventh state value F7 "EWL, OWL" may be set to a value of "110" when fault addresses are repeatedly detected in odd-numbered sub-word lines or even-numbered sub-word lines. The eighth state value F8 "ETC" may be set to a value of "111" when the conditions of the first to seventh state values F1 to F7 are not satisfied. The eighth state value F8 may be set when no relation between fault addresses is found.

Meanwhile, in a sub-word line driver structure described in FIG. 5, when a defect occurs in a contact shared by the sub-word line drivers, sub-word lines driven by the corresponding sub-word line drivers may be defective. For example, when a defect occurs in a contact for the back bias voltage VBBW, which is shared by the first and ninth sub-word line drivers D0 and D8, the first and ninth sub-word lines WL0 and WL8 may be defective. That is, when the sub-word lines at the same order, among eight sub-word lines coupled to each of the two adjacent main word lines, are defective, the defect in the contact shared by the corresponding sub-word line drivers may be the cause.

Furthermore, in a sub-word line driver structure described in FIG. 5, when a defect occurs in a signal path for applying a word line selection signal, sub-word lines driven by sub-word line drivers receiving the corresponding word line selection signal may be defective. For example, when a defect occurs in a signal path for applying a first word line selection signal FX0 is defective, the first and ninth sub-word lines WL0 and WL8 driven by the first and ninth sub-word line drivers D0 and D8 may be defective. That is, when the sub-word lines at the same order, among eight sub-word lines coupled to each of a plurality of main word lines, are defective, the defect in the signal path commonly provided to the corresponding sub-word line drivers may be the cause.

Referring to FIG. 11, FSM 332 may initialize the fault mode information FSM_ST to the first state value of "000". When a first fault address is input, the FSM 332 may update the fault mode information FSM_ST from the first state value of "000" to the second state value of "001". Whenever a subsequent fault address is input, the FSM 332 may compare the first comparison address FADD1 with the second comparison address FADD2 to update the fault mode information FSM_ST to one of the third to eighth state values. For example, in a state that the fault mode information FSM_ST is set to the second state value of "001", when a subsequent fault address is detected in odd-numbered sub-word lines or even-numbered sub-word lines coupled to one main word line as a result of comparing the first comparison address FADD1 with the second comparison address FADD2, the FSM 332 may update the fault mode information FSM_ST from the second state value of "001" to the third state value of "010". The transition (i.e., update) between the state values of FIG. 11 will be described with reference to FIGS. 13 to 18.

Hereinafter, an operation of a fault information management circuit 184 according to an embodiment of the present disclosure will be described with reference to FIGS. 7 to 12.

Figure 12:
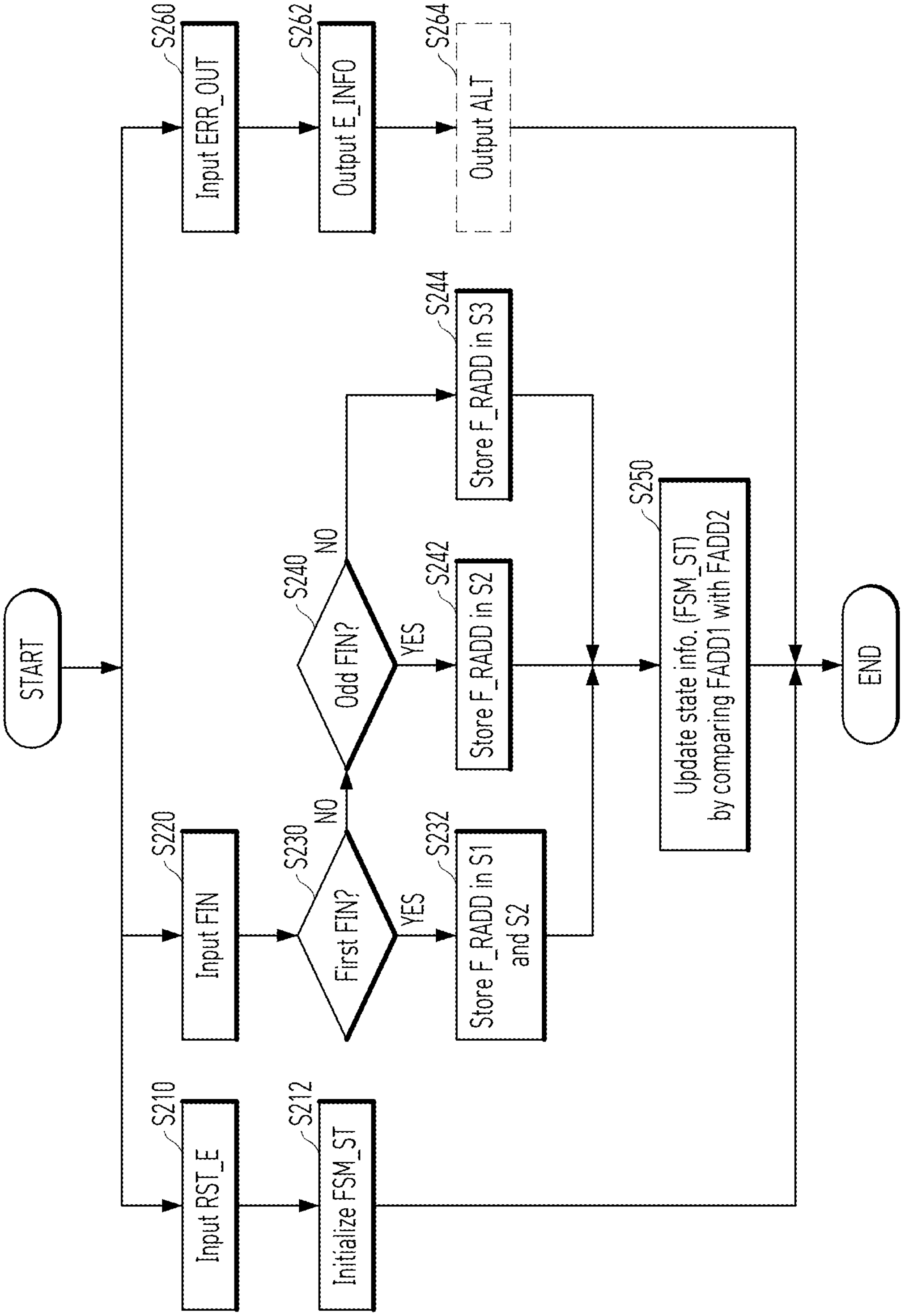
FIG. 12 is a flowchart describing an operation of a fault information management circuit of FIG. 7.

FIG. 12 is a flowchart describing an operation of a fault information management circuit of FIG. 7.

Referring to FIG. 12, when a reset signal RST_E is input from a scrub control circuit 160 (at S210), a fault analysis circuit 330 may initialize fault mode information FSM_ST (at S212). For example, the fault analysis circuit 330 may initialize the fault mode information FSM_ST to the first state value of "000".

Meanwhile, fault address F_RADD may be input together with fault input signal FIN from a fault detection circuit 182 (at S220). When the fault input signal FIN is input for the first time after the reset signal RST_E is input ("YES" in S230), an address storage circuit 310 may store the fault address F_RADD as a start fault address S_FADD in first address storage S1. At the same time, the address storage circuit 310 may store the fault address F_RADD as first comparison address FADD1 in second address storage S2 (at S232). As the start fault address S_FADD is stored, the FSM 332 may update the fault mode information FSM_ST from the first state value of "000" to the second state value of "001" (at S250).

On the other hand, when the fault input signal FIN is not initially input for the first time after the reset signal RST_E is input ("NO" in S230), the address storage circuit 310 may store the fault address F_RADD as the first comparison address FADD1 or the second comparison address FADD2 according to an input order of the fault input signal FIN. When the fault input signal FIN is input with an odd-numbered order ("YES" in S240), the address storage circuit 310 may store the fault address F_RADD as the first comparison address FADD1 in second address storage S2 (at S242). On the other hand, when the fault input signal FIN is input with an even-numbered order ("NO" in S240), the address storage circuit 310 may store the fault address F_RADD as the second comparison address FADD2 in third address storage S3 (at S244). The FSM 332 may update the fault mode information FSM_ST to one of the third to eighth state values according to a result of comparing the first comparison address FADD1 with the second comparison address FADD2, based on the state value of the current fault mode information FSM_ST (at S250).

The error information request command ERR_OUT may be input from the memory controller (at S260). An information output circuit 334 may output the error information E_INFO including the start fault address S_FADD and update fault mode information FSM_ST (at S262). According to an embodiment, when a multi-row fault mode by two or more rows is specified according to the fault mode information FSM_ST, the information output circuit 334 may selectively output the alert signal ALT (at S264).

FIGS. 13 to 18 are flowcharts describing operations of a finite state machine according to an embodiment of the present disclosure.

Prior to describing each operation, as described in FIG. 3, each of a first comparison address FADD1 and a second comparison address FADD2 may be divided into an upper bit group UP_B for designating main word lines and a lower bit group DN_B for designating eight sub-word lines. A finite state machine (FSM 332) may compare the upper bit group UP_B and the lower bit group DN_B of the first comparison address FADD1, with those of the second comparison address FADD2, respectively, and determine a relationship between a current fault address and a subsequent fault address as follows.

(1) When the upper bit groups UP_B of the first comparison address FADD1 and the second comparison address FADD2 are the same: It is determined that the current fault address and the subsequent fault address exist in the same main word line.

(2) When a difference between values of the upper bit groups UP_B is 1, it is determined that the current fault address and the subsequent fault address exist in adjacent main word lines.

(3) When a difference between values of the upper bit groups UP_B is greater than or equal to 2: It is determined that the current fault address and the subsequent fault address do not exist in the same main word line or adjacent main word lines.

(4) When the lower bit groups DN_B of the first comparison address FADD1 and the second comparison address FADD2 are the same: It is determined that the current fault address and the subsequent fault address exist in sub-word lines at the same order, among the eight sub-word lines coupled to each of the main word lines.

(5) When a least significant bits (LSBs) of the lower bit groups DN_B are the same: It is determined that both the current fault address and the subsequent fault address exist in odd-numbered sub-word lines or even-numbered sub-word lines.

Figure 13:
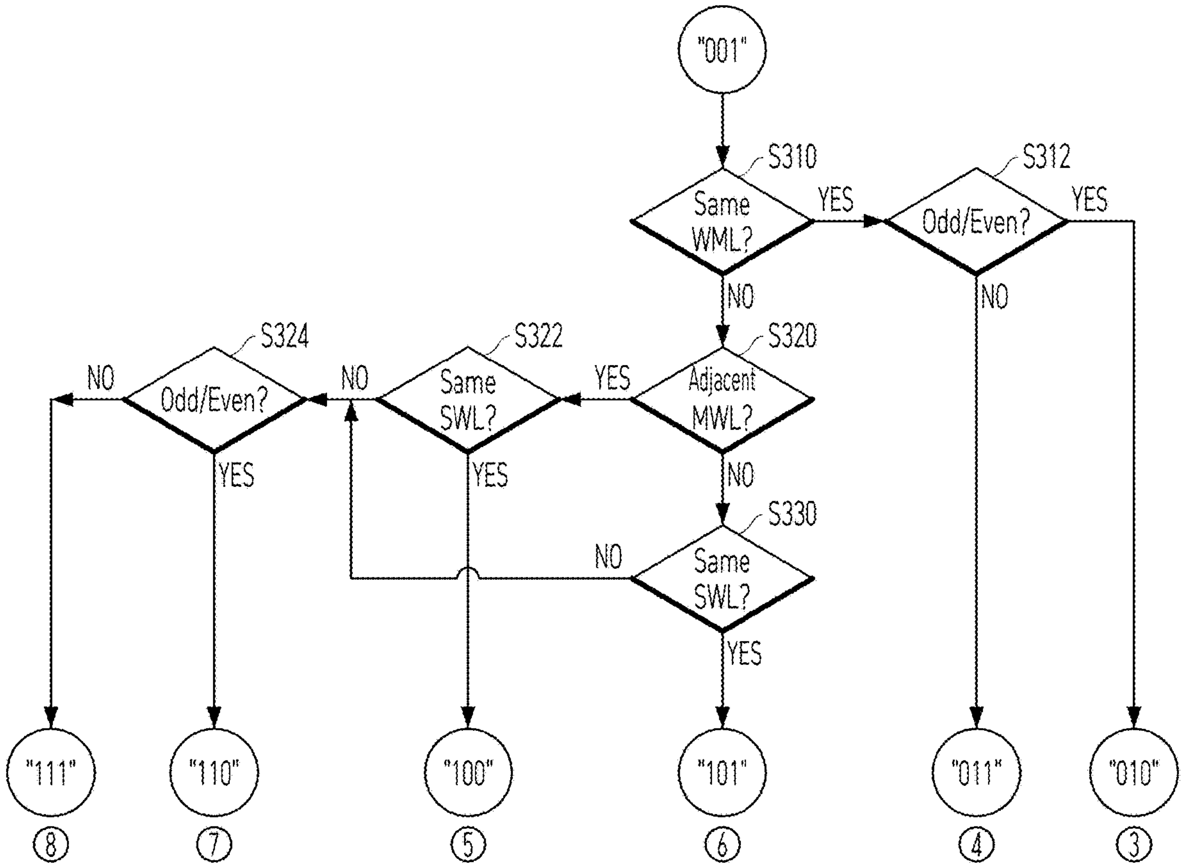
FIGS. 13 to 18 are flowcharts describing operations of a finite state machine according to an embodiment of the present disclosure.

Referring to FIG. 13, an operation of FSM 332 is illustrated when the fault mode information FSM_ST has been set to the second state value of "001" after a first fault address was detected.

When a subsequent fault address and the previous (i.e., the first) fault address are detected only in odd-numbered or even-numbered sub-word lines coupled to the same main word line ("YES" in S310 & "YES" in S312), the FSM 332 may transition the fault mode information FSM_ST from the second state value of "001" to the third state value of "010" (③ of FIG. 11). On the other hand, when the subsequent fault address and the previous fault address are detected in the same main word line but not in sub-word lines at the same order ("YES" in S310 & "NO" in S312), the FSM 332 may transition the fault mode information FSM_ST from the second state value of "001" to the fourth state value of "011" (④ of FIG. 11).

In addition, when the subsequent fault address and the previous fault address are detected in the sub-word lines at the same order, which are coupled to two adjacent main word lines ("YES" in S320 & "YES" in S322), the FSM 332 may transition the fault mode information FSM_ST from the second state value of "001" to the fifth state value of "100" (⑤ of FIG. 11). On the other hand, when the subsequent fault address and the previous fault address are detected only in odd-numbered or even-numbered sub-word lines coupled to two adjacent main word lines ("YES" in S320 & "NO" in S322 & "YES" in S324), the FSM 332 may transition the fault mode information FSM_ST from the second state value of "001" to the seventh state value of "110" (⑦ of FIG. 11). When the subsequent fault address and the previous fault address are detected in two adjacent main word lines but not in the sub-word lines at the same order ("YES" in S320 & "NO" in S322 & "NO" in S324), the FSM 332 may transition the fault mode information FSM_ST from the second state value of "001" to the eighth state value of "111" (⑧ of FIG. 11).

In addition, when the subsequent fault address and the previous fault address do not exist in adjacent main word lines, but are detected in sub-word lines at the same order ("NO" in S310 & "NO" in S320 & "YES" in S330), the FSM 332 may transition the fault mode information FSM_ST from the second state value of "001" to the sixth state value of "101" (⑥ of FIG. 11). On the other hand, when the subsequent fault address and the previous fault address do not exist in adjacent main word lines but are detected only in odd-numbered or even-numbered sub-word lines ("NO" in S330 & "YES" in S324), the FSM 332 may transition the fault mode information FSM_ST from the second state value of "001" to the seventh state value of "110" (⑦ of FIG. 11). When the subsequent fault address and the previous fault address are not detected in the sub-word lines at the same order ("NO" in S330 & "NO" in S324), the FSM 332 may transition the fault mode information FSM_ST from the second state value of "001" to the eighth state value of "111" (⑧ of FIG. 11).

As described above, when the current fault mode information FSM_ST is set to the second state value of "001", the FSM 332 may set the fault mode information FSM_ST to one of the third to eighth state values.

Figure 14:
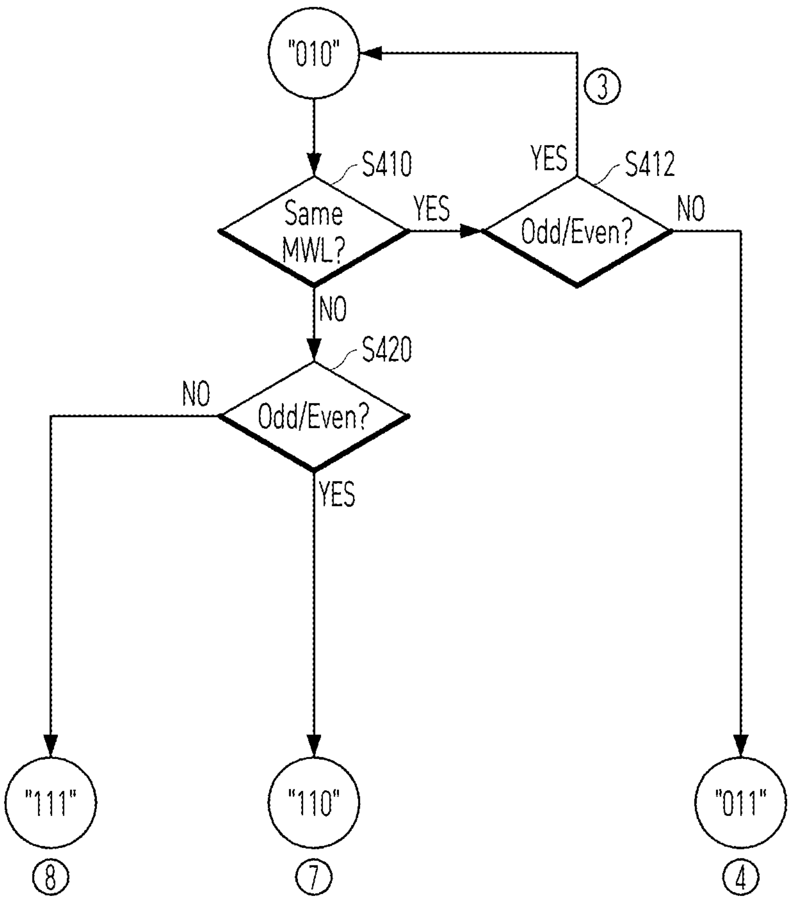

Referring to FIG. 14, an operation of FSM 332 is illustrated when fault mode information FSM_ST has been set to the third status value of "010" after fault addresses are detected in odd-numbered or even-numbered sub-word lines coupled to one main word line.

When the subsequent fault address and the previous fault address are detected only in odd-numbered or even-numbered sub-word lines couple to the same main word line ("YES" in S410 & "YES" in S412), the FSM 332 may maintain the fault mode information FSM_ST with the third status value of "010" (③ of FIG. 11). On the other hand, when the subsequent fault address and the previous fault address are detected in the same main word line but not in sub-word lines at the same order ("YES" in S410 & "NO" in S412), the FSM 332 may transition the fault mode information FSM_ST from the third status value of "010" to the fourth state value of "011" (④ of FIG. 11). In addition, when the subsequent fault address and the previous fault address do not exist in adjacent main word lines but are detected only in odd-numbered or even-numbered sub-word lines ("NO" in S410 & "YES" in S420), the FSM 332 may transition the fault mode information FSM_ST from the third state value of "010" to the seventh state value of "110" (⑦ of FIG. 11). When the subsequent fault address and the previous fault address are not detected in sub-word lines at the same order ("NO" in S410 & "NO" in S420), the FSM 332 may transition the fault mode information FSM_ST from the third state value of "010" to the eighth state value of "111" (⑧ of FIG. 11).

Figure 15:
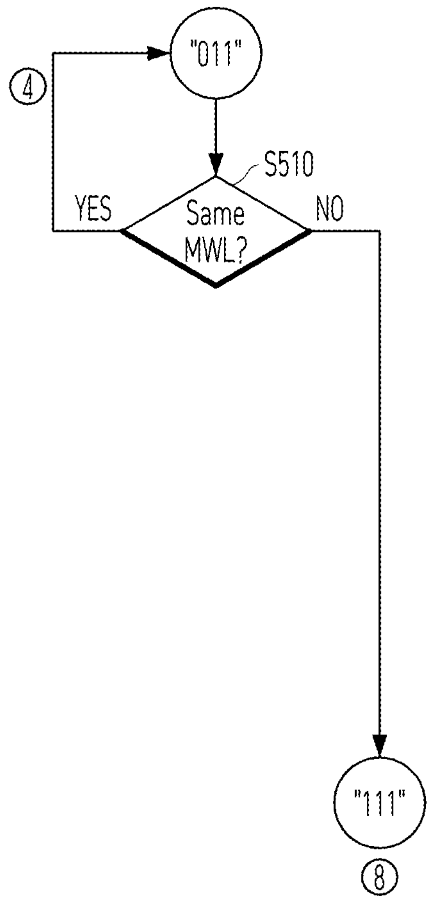

Referring to FIG. 15, an operation of FSM 332 is illustrated when fault mode information FSM_ST has been set to the fourth state value of "011" after fault addresses are detected only in sub-word lines coupled to one main word line.

When the subsequent fault address and the previous fault address are detected in the same main word line ("YES" in S510), the FSM 332 may maintain the fault mode information FSM_ST with the fourth state value of "011" (④ of FIG. 11). On the other hand, when the subsequent fault address and the previous fault address are detected in different main word lines ("NO" in S510), the FSM 332 may transition the fault mode information FSM_ST from the fourth state value of "011" to the eighth state value of "111" (⑧ of FIG. 11).

Figure 16:
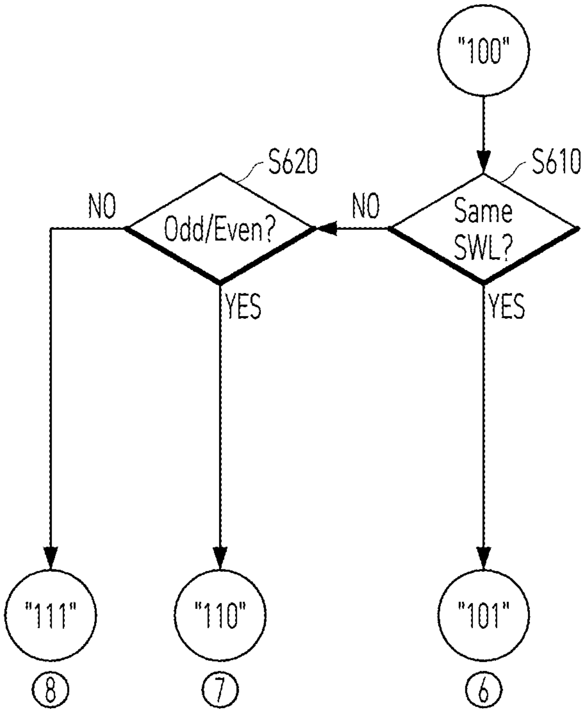

Referring to FIG. 16, an operation of FSM 332 is illustrated when fault mode information FSM_ST has been set to the fifth state value of "100" after fault addresses are detected in sub-word lines at the same order, among sub-word lines coupled to two adjacent main word lines.

When the subsequent fault address and the previous fault address are repeatedly detected in sub-word lines at the same order ("YES" in S610), the FSM 332 may transition the fault mode information FSM_ST from the fifth state value of "100" to the sixth state value of "101" (⑥ of FIG. 11).

On the other hand, when the subsequent fault address and the previous fault address are detected only in odd-numbered or even-numbered sub-word lines ("NO" in S610 & "YES" in S620), the FSM 332 may transition the fault mode information FSM_ST from the fifth state value of "100" to the seventh state value of "110" (⑦ of FIG. 11). When the subsequent fault address and the previous fault address are not detected from specific sub-word lines ("NO" in S610 & "NO" in S620), the FSM 332 may transition the fault mode information FSM_ST from the fifth state value of "100" to the eighth state value of "111" (⑧ of FIG. 11).

Figure 17:
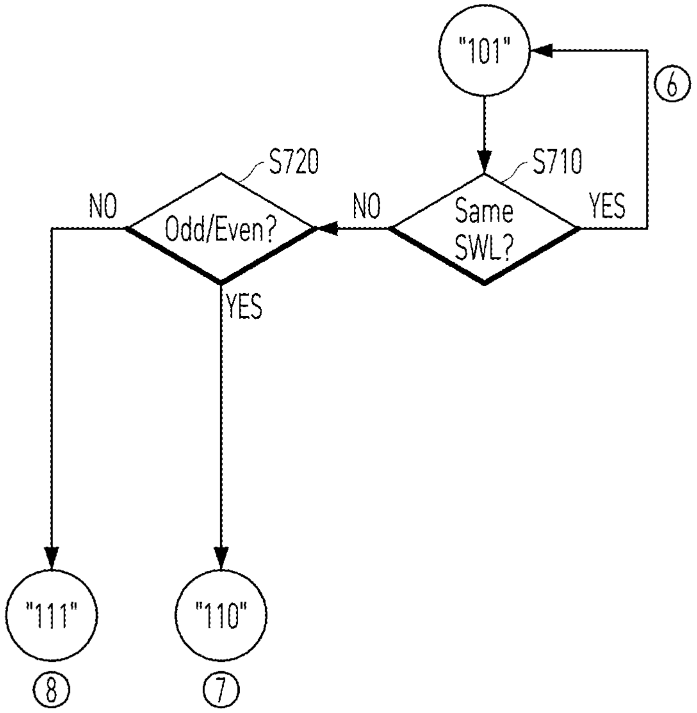

Referring to FIG. 17, an operation of FSM 332 is illustrated when the fault mode information FSM_ST has been set to the sixth state value of "101" after the fault addresses are repeatedly detected in sub-word lines at the same order, among sub-word lines coupled to a plurality of main word lines.

When the subsequent fault address and the previous fault address are repeatedly detected in sub-word lines at the same order ("YES" of S710), the FSM 332 may maintain the fault mode information FSM_ST at the sixth state value of "101" (⑥ of FIG. 11).

On the other hand, when the subsequent fault address and the previous fault address are detected only in odd-numbered or even-numbered sub-word lines ("NO" in S710 & "YES" in S720), the FSM 332 may transition the fault mode information FSM_ST from the sixth state value of "101" to the seventh state value of "110" (⑦ of FIG. 11). When the subsequent fault address and the previous fault address are not detected in the sub-word lines at the same order ("NO" in S710 & "NO" in S720), the FSM 332 may transition the fault mode information FSM_ST from the sixth state value of "101" to the eighth state value of "111" (⑧ of FIG. 11).

Figure 18:
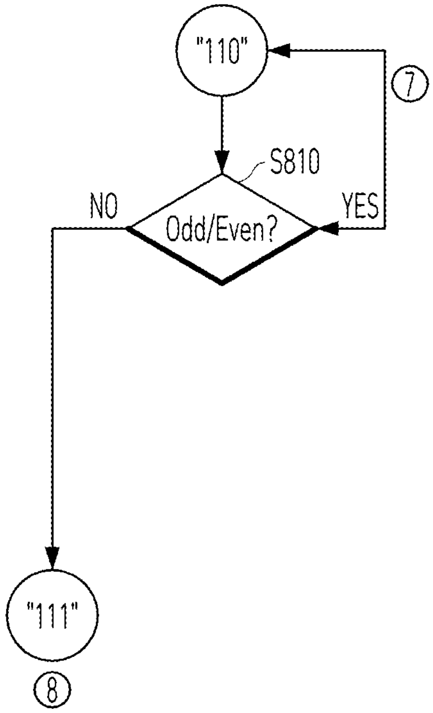

Referring to FIG. 18, an operation of FSM 332 is illustrated when fault mode information FSM_ST has been set to the seventh state value of "110" after fault addresses are repeatedly detected in odd-numbered or even-numbered sub-word lines.

When the subsequent fault address and the previous fault address are detected only in odd-numbered or even-numbered sub-word lines ("YES" of S810), the FSM 332 may maintain the fault mode information FSM_ST with the seventh state value of "110" (⑦ of FIG. 11). On the other hand, when the subsequent fault address and the previous fault address are not detected in specific sub-word lines ("NO" of S810), the FSM 332 may transition the fault mode information FSM_ST from the seventh state value of "110" to the eighth state value "of 111" (⑧ of FIG. 11).

As described in FIGS. 12 to 18, a memory device 100 according to an embodiment of the present disclosure may store a fault address F_RADD, first detected during an error check operation for each row, as the start fault address S_FADD and update fault mode information FSM_ST that defines the relationship between the start fault address S_FADD and the subsequent fault addresses F_RADD, whenever the fault address is subsequently detected.

Figure 19:
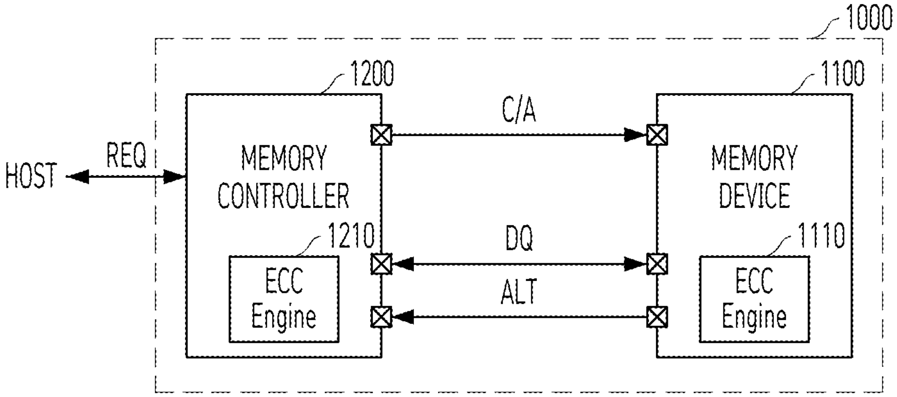
FIG. 19 is a block diagram illustrating a memory system according to an embodiment of the present disclosure.

FIG. 19 is a block diagram illustrating a memory system according to an embodiment of the present disclosure.

Referring to FIG. 19, a memory system 1000 may include a memory device 1100 and a memory controller 1200.

The memory controller 1200 may control an overall operation of the memory system 1000 and control a data exchange between a host and the memory device 1100. The memory controller 1200 may generate a command/address signal C/A in response to a request REQ from the host and provide the command/address signal C/A to the memory device 1100. The memory controller 1200 may provide the command/address signal C/A indicating an active operation, a precharge operation, a read operation, a write operation, an error check operation, an error information request operation, and the like to the memory device 1100. The memory controller 1200 may provide data DQ corresponding to the request REQ provided from the host to the memory device 1100. The memory controller 1200 may provide the data DQ read from the memory device 1100 to the host. The memory controller 1200 may include an ECC engine 1210 to provide error corrected data by correcting an error of the data DQ read from the memory device 1100. When the number of error bits of the data DQ exceeds an error correction capability of the ECC engine 1210, the memory controller 1200 may notify the host that an uncorrectable error (UE) has occurred.

The memory device 1100 may have substantially the same configuration as a memory device 100 of FIG. 1. The memory device 1100 may include an ECC engine 1110. The memory device 1100 may further include a scrub control circuit and an error logging circuit (not illustrated). The memory device 1100 may store a fault address F_RADD first detected during the error check operation for each row as a start fault address S_FADD, and update fault mode information FSM_ST defining a relationship between the start fault address S_FADD and subsequent fault addresses F_RADD whenever the fault address is subsequently detected. The memory device 1100 may provide error information E_INFO including the fault mode information FSM_ST as well as the start fault address S_FADD to the memory controller 1200 according to an error information request command ERR_OUT. According to an embodiment, when a multi-row fault mode is specified by the fault mode information FSM_ST, the memory device 1100 may output an alert signal ALT to the memory controller 1200.

Figure 20:
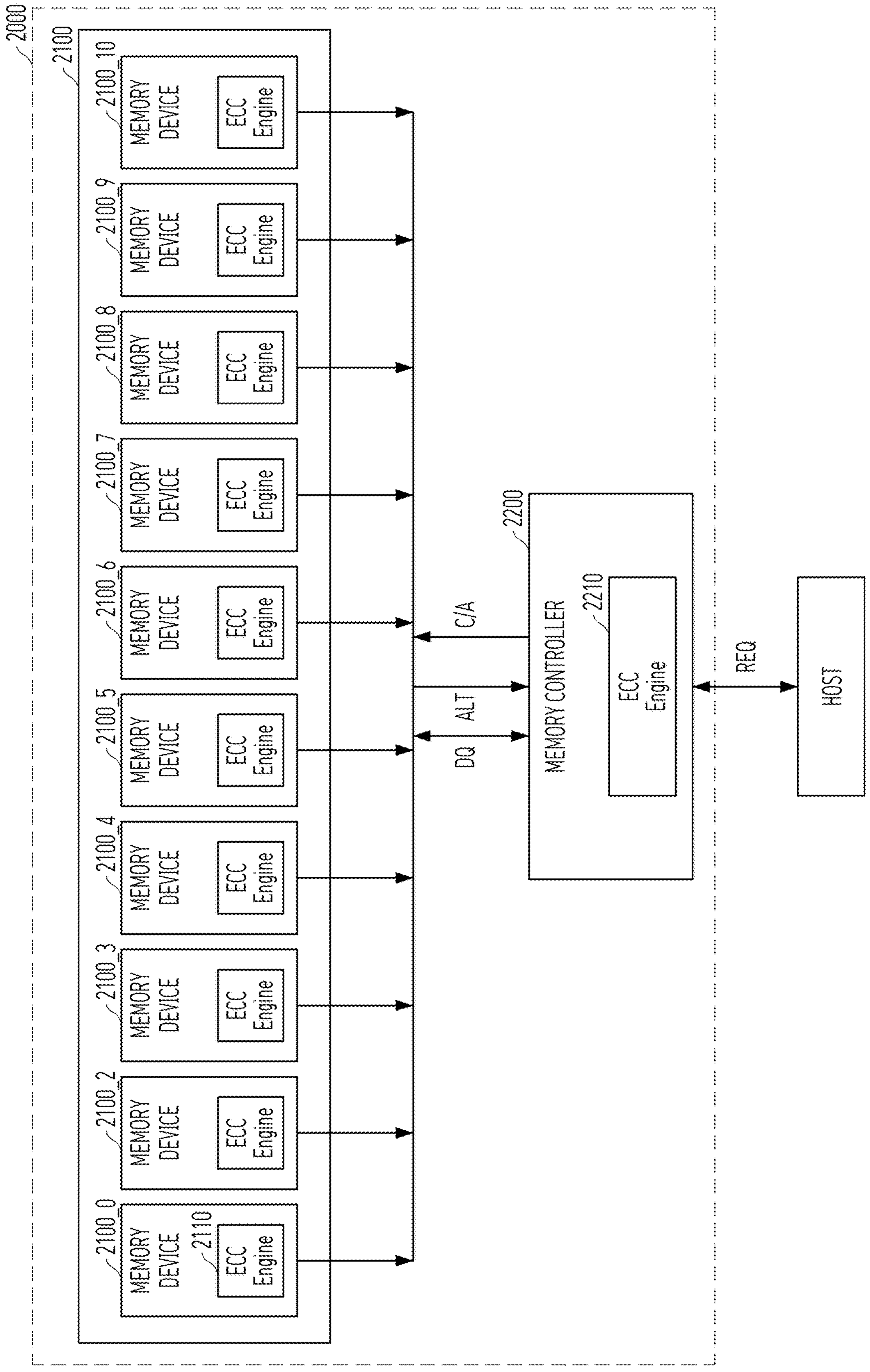
FIG. 20 is a block diagram illustrating a memory system including a memory module according to an embodiment of the present disclosure.

FIG. 20 is a block diagram illustrating a memory system including a memory module according to an embodiment of the present disclosure.

Referring to FIG. 20, a memory system 2000 may include a memory module 2100 and a memory controller 2200.

The memory controller 2200 may control an overall operation of the memory system 2000 and control a data exchange between a host and the memory module 2100. The memory controller 2200 may generate a command/address signal C/A according to a request REQ from the host to provide the command/address signal C/A to the memory module 2100, and provide data DQ corresponding to the request REQ from the host to the memory module 2100, and provide data DQ read from the memory module 2100 to the host. The memory controller 2200 may include an ECC engine 2210 to provide error corrected data by correcting an error of the data DQ read from the memory module 2100. When the number of error bits of the data DQ exceeds an error correction capability of the ECC engine 2210, the memory controller 2200 may notify the host that an uncorrectable error (UE) has occurred.

The memory module 2100 may include a plurality of memory devices 2100_0 to 2100_10. Each of the memory devices 2100_0 to 2100_10 may include an ECC engine 2110. Each of the memory devices 2100_0 to 2100_10 may correspond to a memory device 100 described above with reference to FIG. 1. Each of the memory devices 2100_0 to 2100_10 may further include a scrub control circuit and an error logging circuit. Each of the memory devices 2100_0 to 2100_10 may may store a fault address F_RADD first detected during the error check operation for each row as a start fault address S_FADD, and update fault mode information FSM_ST defining a relationship between the start fault address S_FADD and subsequent fault addresses F_RADD whenever the fault address is subsequently detected. Each of the memory devices 2100_0 to 2100_10 may provide error information E_INFO including the fault mode information FSM_ST as well as the start fault address S_FADD to the memory controller 2200 according to an error information request command ERR_OUT. According to an embodiment, when a multi-row fault mode is specified by the fault mode information FSM_ST, each of the memory devices 2100_0 to 2100_10 may output an alert signal ALT to the memory controller 2200.

Figure 21:
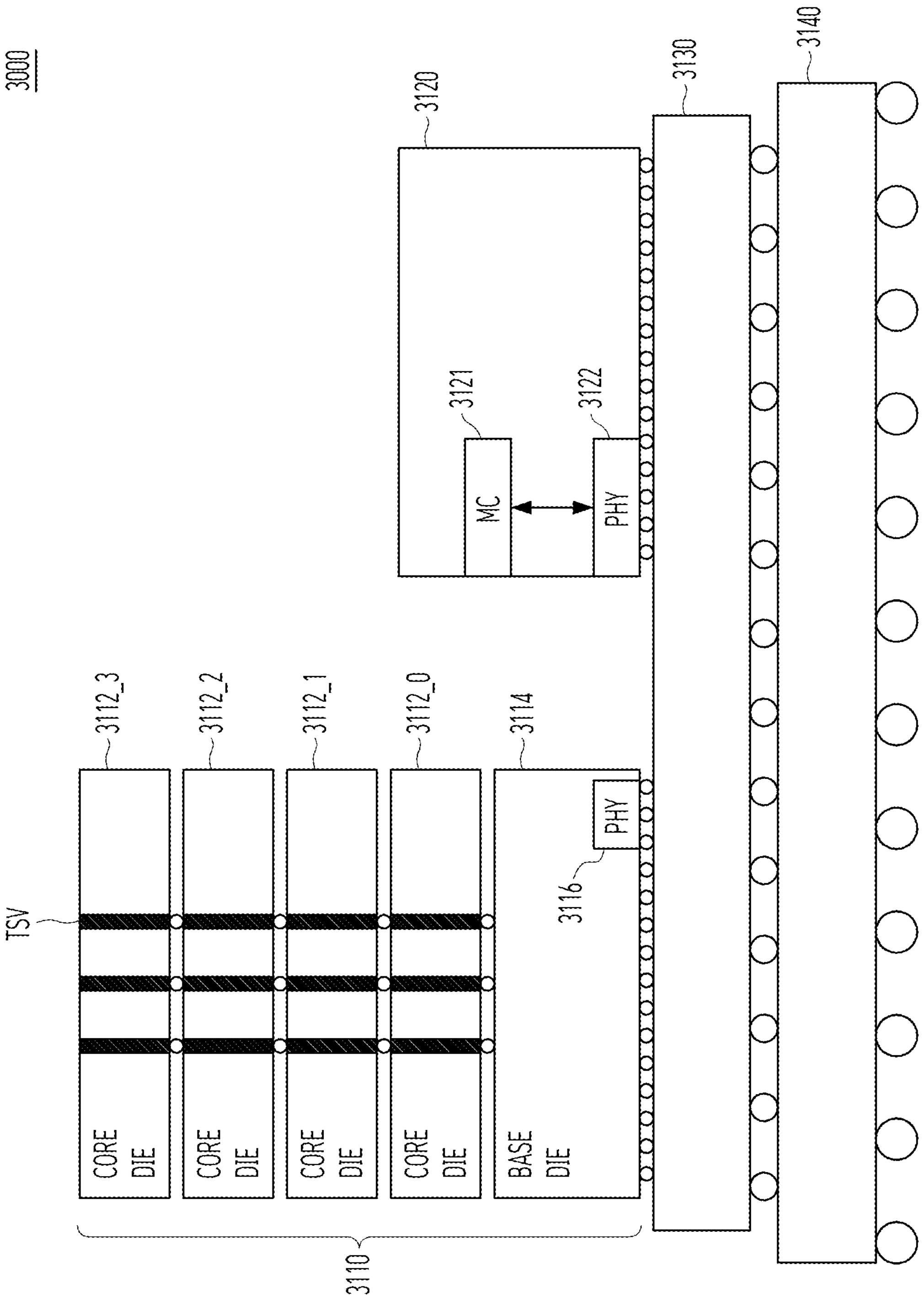
FIG. 21 is a block diagram illustrating a memory system including a stacked memory device according to an embodiment of the present disclosure.

FIG. 21 is a block diagram illustrating a memory system including a stacked memory device according to an embodiment of the present disclosure.

Referring to FIG. 21, a memory system 3000 may include a package board/substrate 3140, an interposer 3130, one or more stacked memory device 3110, and a processor 3120.

The package board/substrate 3140 may include a printed circuit board (PCB). The package board/substrate 3140 may be electrically connected to an external system board, main board, or module board through bumps.

The interposer 3130 may be formed on the package board/substrate 3140. The interposer 3130 may be a silicon substrate in which only wiring is formed.

The stacked memory device 3110 and the processor 3120 may be formed on the interposer 3130. The stacked memory device 3110 and the processor 3120 may be disposed on the interposer 3130 to be spaced apart from each other. Meanwhile, although one stacked memory device 3110 is illustrated in FIG. 21, the present invention is not limited thereto, and one or more stacked memory devices may be formed on the interposer 3130.

The processor 3120 may include a memory controller (MC) 3121 and a physical interface circuit (PHY) 3122. The memory controller 3121 may be configured to control the stacked memory device 3110. The physical interface circuit 3122 may interface between the memory controller 3121 and the stacked memory device 3110. The physical interface circuit 3122 may be an interface circuit that converts signals transferred from the memory controller 3121 into signals suitable for use in the stacked memory device 3110 and outputs the signals transferred from the stacked memory device 3110 into signals suitable for use in the memory controller 3121. The processor 3120 may be one of various processors such as a micro-processing unit (MPU), a central processing unit (CPU), a general processing unit (GPU), and a host processing unit (HPU).

The stacked memory device 3110 may include a lower chip 3114 and one or more upper chips 3112_0 to 3112_3 vertically stacked on the interposer 3130. An example of the stacked memory device 3110 formed by stacking a plurality of chips as described above may be a high bandwidth memory (HBM). Through electrodes TSV are formed between the lower chip 3114 and the upper chips 3112_0 to 3112_3, through which signals (i.e., commands, addresses, and data) may be transferred between the chips.

The lower chip 3114 may include a physical interface circuit (PHY) 3116 for an interface with the memory controller 3121. Each of the upper chips 3112_0 to 3112_3 may correspond to a memory device 100 described in FIG. 1. That is, each of the upper chips 3112_0 to 3112_3 may further include a scrub control circuit and an error logging circuit. Each of the upper chips 3112_0 to 3112_3 may may store a fault address F_RADD first detected during the error check operation for each row as a start fault address S_FADD, and update fault mode information FSM_ST defining a relationship between the start fault address S_FADD and subsequent fault addresses F_RADD whenever the fault address is subsequently detected. Each of the upper chips 3112_0 to 3112_3 may provide error information E_INFO including the fault mode information FSM_ST as well as the start fault address S_FADD to the memory controller 3121 according to an error information request command ERR_OUT. According to an embodiment, when a multi-row fault mode is specified according to the fault mode information FSM_ST, each of the upper chips 3112_0 to 3112_3 may output an alert signal ALT to the memory controller 3121.

In above-described embodiments, a memory device includes an ECC engine and performs an error check operation and an error logging operation, but the present invention is not limited thereto. According to an embodiment, when no ECC engine is disposed in a memory device, the memory controller may perform an error check operation and an error logging operation. For example, a memory controller may transmit a row address and a column address to a memory device along with a scrub command, the memory device may read data from a corresponding row and column, and the memory controller may perform an error check operation and an error logging operation for each row based on the read data.

Figure 22:
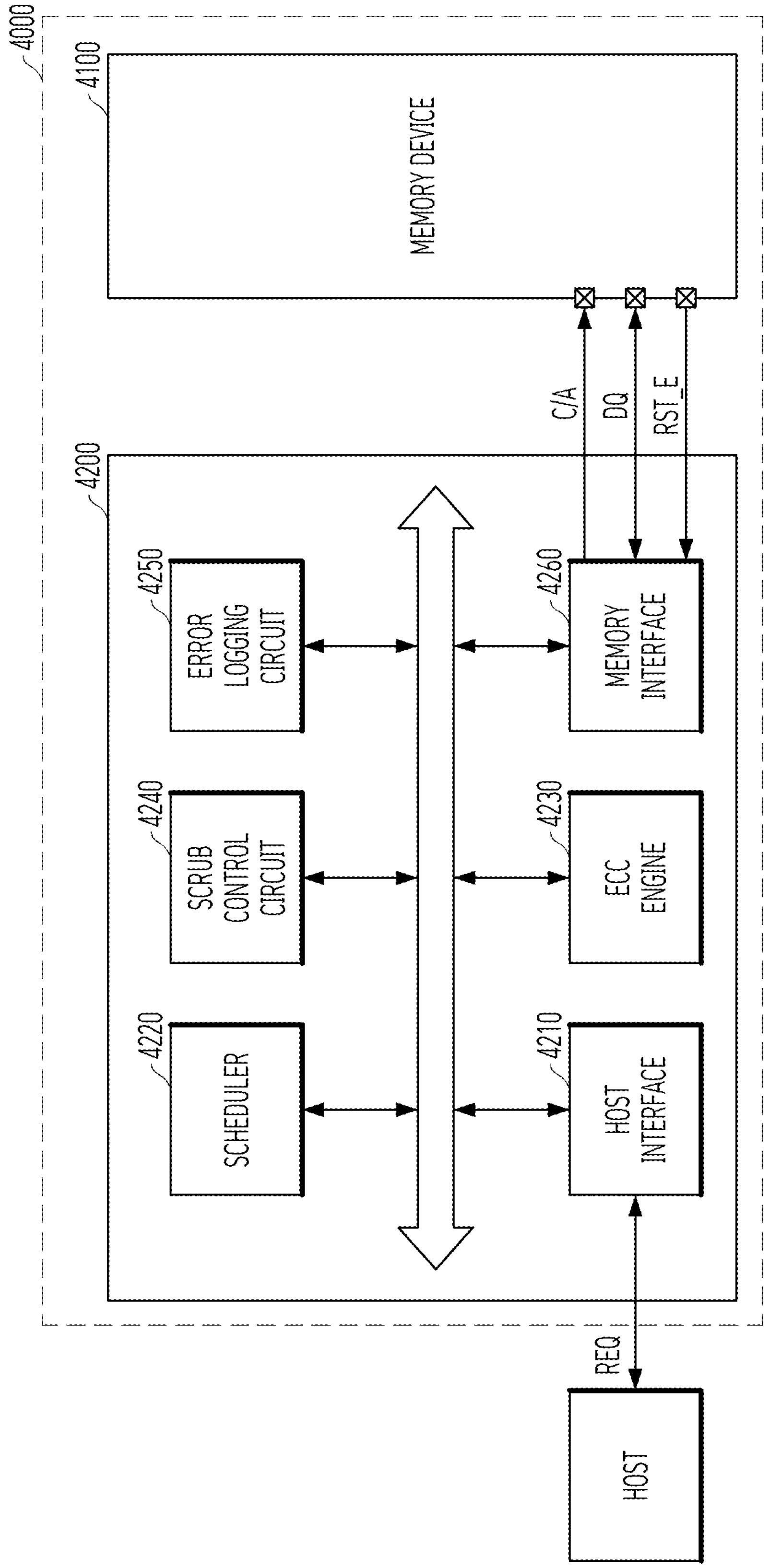
FIG. 22 is a block diagram illustrating a memory system according to another embodiment of the present disclosure.

FIG. 22 is a block diagram illustrating a memory system according to another embodiment of the present disclosure.

Referring to FIG. 22, a memory system 4000 may include a memory device 4100 and a memory controller 4200.

The memory controller 4200 may control an overall operation of the memory system 4000 and control a data exchange between a host and the memory device 4100. The memory controller 4200 may generate a command/address signal C/A in response to a request REQ from the host and provide the command/address signal C/A to the memory device 4100. The memory controller 4200 may provide the command/address signal C/A indicating an active operation, a precharge operation, a read operation, a write operation, an error check operation, an error information request operation, and the like to the memory device 4100. The memory controller 4200 may provide data DQ corresponding to the request REQ provided from the host to the memory device 4100. The memory controller 4200 may provide the data DQ read from the memory device 4100 to the host.

The memory device 4100 may include dynamic random access memory (DRAM) including dynamic memory cells.

The memory device 4100 may be double data rate 4 (DDR4) synchronic DRAM (SDRAM), DDR5 SDRAM, low-power DDR4 (LPDDR4) SDRAM, LPDDR5 SDRAM, or others. The memory device 4100 may include a memory cell array in which a plurality of memory cells coupled to a plurality of rows and a plurality of columns are arranged in an array form.

The memory controller 4200 may include a host interface 4210, a scheduler 4220, an error correction code (ECC) engine 4230, a scrub control module 4240, an error logging module 4250, and a memory interface 4260.

The host interface 4210 may be an interface for communication between a host and the memory controller 4200.

The scheduler 4220 may receive a request REQ from the host through the host interface 4210. The scheduler 4220 may generate various commands (e.g., an active command, a precharge command, a read command, a write command, a repair command, etc.) and address, according to the request REQ. The scheduler 4220 may set the order of requests to be instructed to the memory device 4100 among the requests REQs from the host and generate a command to be applied to the memory device 4100 according to the order of the predetermined operations. To improve the performance of the memory device 4100, the scheduler 4220 may change the order in which the requests REQs are received from the host and the order of the operations to be instructed to the memory device 4100. For example, the scheduler 4220 may adjust the order so that a write operation is performed before a read operation, even if the host requests the read operation of the memory device 100 first and the write operation later.

The ECC engine 4230 may correct an error in data DQ read from the memory device 4100, and provide the corrected data to the host. Correction of the error may include an error check operation for checking for an error in the data DQ and an error correction operation for correcting an error in the data DQ when an error is found.

The scrub control module 4240 may provide an address for a row and a column to be scrubbed to the memory device 4100 together with a scrub command instructing a scrub operation during a scrub period. The memory device 4100 may perform a scrub operation on memory cells connected between the row and the column selected by the address, according to the scrub command. The memory device 4100 may perform a scrub operation including a read operation for reading data of the selected memory cells and providing the read data to the memory controller 4200, and/or a write operation for re-writing error-corrected data provided from the memory controller 4200 to the selected memory cells.

The ECC engine 4230 may perform an error check operation, to check for an error in the data DQ read from the memory device 4100 during a scrub operation, to generate an error signal ERR when an error is found.

The error logging module 4250 may log an error found during the error check operation according to the scrub command. The error logging module 4250 may generate error information according to the logging result to provide the error information to the host. According to an embodiment, the error logging module 4250 may correspond to an error logging circuit 180 of FIG. 1. That is, the error logging module 4250 may include a fault detection circuit and a fault information management circuit.

The memory device 4100 may include a plurality of cell blocks each including a plurality of memory cells MC as described above with reference to FIGS. 2A and 2B. The memory device 4100 may provide a reset signal RST_E, activated when a scrub operation for rows included in at least two adjacent cell blocks among the plurality of cell blocks is completed, to the memory controller 4200.

Accordingly, when a fault address is generated according to a scrub operation for each row, the fault detection circuit may output a fault address together with a fault input signal. The fault information management circuit may store a fault address input for the first time after activation of the reset signal RST_E as a start fault address and generate fault mode information that defines a relationship between the stored start fault address and subsequently input fault addresses. The fault information management circuit may provide the error information including the start fault address and the fault mode information to the host. The fault information management circuit may initialize the fault mode information according to the reset signal RST_E. According to an embodiment, the fault information management circuit may provide an alert signal to the host when a fault mode involving two or more rows is specified according to the fault mode information.

The memory interface 4260 may be configured to communicate with the memory device 4100. For example, the memory interface 4260 may transmit the command/address signal C/A and the data DQ to the memory device 4100 and receive the data DQ read from the memory device 4100.

As described above, in an embodiment, even when no ECC engine is embedded in the memory device 4100, the error logging module 4250 of the memory controller 4200 may generate error information including the start fault address and the fault mode information to identify the fault mode that may occur based on the fault row specified by the start fault address, thereby efficiently managing the error and performing an optimized reliability, accessibility, and serviceability (RAS) operation.

While the present disclosure has been described with respect to the specific embodiments, it will be apparent to those skilled in the art that various changes and modifications may be made without departing from the spirit and scope of the invention as defined in the following claims. Furthermore, the embodiments may be combined to form additional embodiments.

What is claimed is:

1. A memory device, comprising:

a memory cell array including memory cells coupled to a plurality of rows;

a fault detection circuit configured to generate a fault address according to a result of an error check operation for each of the plurality of rows and sequentially outputs the fault addresses together with a fault input signal; and a fault information management circuit configured to generate first to third fault addresses using the fault addresses, to store the first fault address as a start fault address, to store the second and third fault addresses, and to generate fault mode information that defines a relationship between the start fault address and the second and third fault addresses, according to the fault input signal, and to output error information including the start fault address and the fault mode information.

2. The memory device of claim 1, wherein the fault information management circuit is configured to:

sequentially compare the start fault address with the second and third fault addresses according to the fault input signal to update the fault mode information to one of a plurality of state values defining faults of one or more rows related to a defective row specified by the start fault address.

3. The memory device of claim 1, wherein the fault information management circuit is configured to:

output an alert signal when a fault mode caused by two or more rows is specified according to the fault mode information.

4. The memory device of claim 1, further comprising:

a scrub control circuit configured to generate a reset signal activated when the error check operation for rows included in at least two adjacent cell blocks, from among a plurality of cell blocks divided by the plurality of rows, is completed, wherein the first fault address is input for a first time after activation of the reset signal.

5. The memory device of claim 4, wherein the fault information management circuit is configured to:

initialize the fault mode information according to the reset signal.

6. The memory device of claim 1, wherein the fault information management circuit includes:

an address storage circuit configured to store the first fault address as the start fault address according to a reset signal and the fault input signal, store the second fault address as a first comparison address according to the fault input signal input with an odd-numbered order, and store the third fault address as a second comparison address according to the fault input signal input with an even-numbered order; and a fault analysis circuit configured to update the fault mode information according to a result of comparing the first comparison address and the second comparison address, and output the error information including the start fault address and the fault mode information according to an error information request command.

7. The memory device of claim 6, wherein the address storage circuit includes:

a storage controller configured to output the first fault address as the start fault address according to the fault input signal input for a first time after activation of the reset signal, and output the second and third fault addresses as the first and second comparison addresses according to an input order of the fault input signal;

a first address storage configured to store the starting fault address;

a second address storage configured to store the first comparison address; and a third address storage configured to store the second comparison address.

8. The memory device of claim 6, wherein the fault analysis circuit includes:

a finite state machine (FSM) configured to update the fault mode information according to the result of comparing, and initialize the fault mode information according to the reset signal; and an information output circuit configured to output the error information including the start fault address and the fault mode information according to the error information request command.

9. An error logging device, comprising:

a fault detection circuit configured to output a fault address with a fault input signal;

an address storage circuit configured to store the fault address as a start fault address according to a reset signal and the fault input signal, store the fault address as a first comparison address according to the fault input signal inputted with an odd-numbered order, and store the fault address as a second comparison address according to the fault input signal inputted with an even-numbered order;

a finite state machine (FSM) configured to update fault mode information according to a result of comparing the first comparison address and the second comparison address; and an error information output circuit configured to output error information including the fault mode information and the start fault address according to an error information request command.

10. The error logging device of claim 9, wherein the address storage circuit includes:

a storage controller configured to output a first fault address as the start fault address according to the fault input signal input for a first time after activation of the reset signal, and output second and third fault addresses as the first and second comparison addresses according to an input order of the fault input signal;

a first address storage configured to store the starting fault address;

a second address storage configured to store the first comparison address; and a third address storage configured to store the second comparison address.

11. The error logging device of claim 9, wherein the reset signal is provided from a memory device including memory cells coupled to a plurality of rows, and wherein the memory device generates the reset signal activated when an error check operation for rows included in at least two adjacent cell blocks, from among a plurality of cell blocks divided by the plurality of rows, is completed.

12. The error logging device of claim 9, wherein each of the first comparison address and the second comparison address includes a first bit group for designating a main word line and a second bit group for designating a sub-word line, and wherein the FSM updates the fault mode information by comparing the first bit groups of the first comparison address and the second comparison address, and comparing the second bit groups of the first comparison address and the second comparison address.

13. The error logging device of claim 12, wherein the FSM is configured to:

set the fault mode information to a first state value according to the reset signal, and update the fault mode information from the first state value to a second state value as the start fault address is stored.

14. The error logging device of claim 12, wherein, the fault mode information is set to a second state value and the FSM is configured to:

update the fault mode information to a third state value when least significant bits (LSBs) of the second bit groups are the same, in a state in which the first bit groups are the same, update the fault mode information to a fourth state value when the LSBs of the second bit groups are different from each other, in a state in which the first bit groups are the same, update the fault mode information to a fifth state value when the second bit groups are the same in a state in which a difference between values of the first bit groups is 1, update the fault mode information to a sixth state value when the second bit groups are the same in a state in which the difference is greater than or equal to 2, and update the fault mode information to a seventh state value when only the LSBs of the second bit groups are the same in a state in which the difference is greater than or equal to 1.

15. The error logging device of claim 12, wherein the fault mode information is set to a third state value and the FSM is configured to:

maintain the fault mode information to the third state value when least significant bits (LSBs) of the second bit groups are the same, and update the fault mode information to a fourth state value when the LSBs of the second bit groups are different from each other, in a state that the first bit groups are the same, and update the fault mode information to a seventh state value when only the LSBs of the second bit groups are the same in a state that a difference between values of the first bit groups is greater than or equal to 1.

16. The error logging device of claim 12, wherein the fault mode information is set to a fourth state value and the FSM is configured to:

maintain the fault mode information to the fourth state value when the first bit groups are the same.

17. The error logging device of claim 12, wherein the fault mode information is set to a fifth state value and the FSM is configured to:

update the fault mode information to a sixth state value when the second bit groups are the same, and update the fault mode information to a seventh state value when least significant bits (LSBs) of the second bit groups are the same.

18. The error logging device of claim 12, wherein the fault mode information is set to a sixth state value and the FSM is configured to:

maintain the fault mode information to the sixth state value when the second bit groups are the same, and update the fault mode information to a seventh state value when least significant bits (LSBs) of the second bit groups are the same.

19. The error logging device of claim 12, wherein the fault mode information is set to a seventh state value and the FSM is configured to:

maintain the fault mode information to the seventh state value when least significant bits (LSBs) of the second bit groups are the same.

20. An error logging method, comprising:

initializing fault mode information according to a reset signal;

storing a fault address as a starting fault address according to a fault input signal input for a first time after initializing, and updating the fault mode information;

storing the fault address as a first comparison address according to the fault input signal input with an odd-numbered order, storing the fault address as a second comparison address according to the fault input signal input with an even-numbered order, and updating the fault mode information according to a result of comparing the first comparison address and the second comparison address; and outputting error information including the fault mode information and the start fault address according to an error information request command.

21. The error logging method of claim 20, further comprising:

receiving the reset signal from a memory device including memory cells coupled to a plurality of rows, wherein the reset signal is activated when an error check operation for rows included in at least two adjacent cell blocks, from among a plurality of cell blocks divided by the plurality of rows, is completed.

22. The error logging method of claim 20, further comprising:

outputting an alert signal when a fault mode caused by two or more rows is specified by the fault mode information.

23. A memory system, comprising:

a memory controller; and a memory device configured to perform a scrub operation on each of a plurality of rows under a control of the memory controller and generate a reset signal according to the scrub operation, wherein the memory controller includes:

a fault detection circuit configured to generate a fault address according to the scrub operation for each of the plurality of rows and sequentially output the fault addresses together with a fault input signal; and a fault information management circuit configured to generate first to third fault addresses using the fault addresses, to store the first fault address as a start fault address, to store the second and third fault addresses, and to generate fault mode information that defines a relationship between the start fault address and the second and third fault addresses, according to the fault input signal and the reset signal, and to output error information including the start fault address and the fault mode information.

24. The memory system of claim 23, wherein the memory device generates the reset signal activated when the scrub operation for rows included in at least two adjacent cell blocks, from among a plurality of cell blocks divided by the plurality of rows, is completed.

25. The memory system of claim 23, wherein the fault information management circuit is configured to:

output an alert signal when a fault mode caused by two or more rows is specified by the fault mode information, and initialize the fault mode information according to the reset signal.

* * * * *